United States Patent
Wang et al.

(10) Patent No.: US 7,243,317 B2
(45) Date of Patent: Jul. 10, 2007

(54) PARAMETER CHECKING METHOD FOR ON-CHIP ESD PROTECTION CIRCUIT PHYSICAL DESIGN LAYOUT VERIFICATION

(75) Inventors: Albert Zihui Wang, Wilmette, IL (US); Rouying Zhan, Chicago, IL (US)

(73) Assignee: Illinios Institute of Technology, Chicago, IL (US)

( * ) Notice: Subject to any disclaimer, the term of this patent is extended or adjusted under 35 U.S.C. 154(b) by 383 days.

(21) Appl. No.: 10/449,669

(22) Filed: May 30, 2003

(65) Prior Publication Data

US 2004/0243949 A1    Dec. 2, 2004

(51) Int. Cl.
*G06F 17/50* (2006.01)

(52) U.S. Cl. ............................... 716/4; 716/5
(58) Field of Classification Search ............. 716/2–18; 361/56, 58; 703/1, 14, 20
See application file for complete search history.

(56) References Cited

U.S. PATENT DOCUMENTS

| | | | |
|---|---|---|---|
| 5,015,600 A | | 5/1991 | Livermore et al. |
| 5,208,765 A | | 5/1993 | Turnbull |
| 5,477,475 A | | 12/1995 | Sample et al. |
| 5,572,394 A | * | 11/1996 | Ker et al. ............... 361/56 |
| 5,745,363 A | | 4/1998 | Rostoker et al. |
| 5,793,083 A | * | 8/1998 | Amerasekera et al. ...... 257/355 |
| 5,949,694 A | * | 9/1999 | Amerasekera et al. ......... 716/5 |
| 6,061,814 A | | 5/2000 | Sugasawara et al. |
| 6,086,627 A | * | 7/2000 | Bass et al. ..................... 716/5 |
| 6,209,123 B1 | | 3/2001 | Maziasz et al. |
| 6,425,111 B1 | | 7/2002 | del Mar Hershenson |
| 6,446,250 B1 | | 9/2002 | Becker |
| 6,493,580 B1 | * | 12/2002 | Cansell et al. ................. 607/5 |
| 6,493,850 B2 | | 12/2002 | Venugopal et al. |
| 6,553,542 B2 | * | 4/2003 | Ramaswamy et al. ......... 716/2 |
| 6,996,786 B2 | * | 2/2006 | Voldman ....................... 716/2 |
| 2002/0152447 A1 | * | 10/2002 | Venugopal et al. ............ 716/4 |

OTHER PUBLICATIONS

R. Y. Zhan et al., A technology-independent CAD tool for ESD protection extraction—ESDExtractor, Feb. 2002, IEEE, paper No. 0-7803-7607-2/02.*

Li et al., Modeling, Extraction and Simulation of CMOS I/O Circuits under ESD Stress, 1998, IEEE, pp. VI-389 to VI-392.*

Li et al., ESD Design Rule Checker, 2001, IEEE, pp. V-499 to V-502.*

* cited by examiner

*Primary Examiner*—Vuthe Siek
*Assistant Examiner*—Nghia M. Doan
(74) *Attorney, Agent, or Firm*—Pauley Peterson & Erickson

(57) ABSTRACT

A checking mechanism for complete full-chip ESD protection circuit design and layout verification at layout level identifies all of both intentional and parasitic ESD devices contained in the design layout file and compiles a netlist. The checking mechanism then determines the critical operating parameters of the identified ESD devices and determines if the parasitic devices will negatively effect ESD protection performance. The checking mechanism then determines if the intentional devices meet design specifications; eliminates parasitic devices which will not negatively effect ESD protection from the netlist, and retains those parasitic devices which may lead to ESD protection malfunction. Design layout verification and faults are then reported.

26 Claims, 15 Drawing Sheets

MG of LVSCR

MG of ggNMOS

DIODE ESD-CRITICAL PARAMETER EXTRACTION
-- CALCULATE Vt1, It1, Ih, Vh $$I_{t1} = I_s \{\exp(qV_{on}/nkT)-1\}$$

$$V_{tl} = V_{on}$$

$$--R_{on} = 0.9*nkT/qI_s$$

FIG.6(a)

$V_{on}$ = p-n JUNCTION DIODE FORWARD TURN-ON VOLTAGE, TYPICALLY 0.65v FOR Si IN ROOM TEMPERATURE.

$I_S$ IS A CONSTANT CURRENT TERM IN A p-n JUNCTION DIODE GIVEN BY THE CLASSIC SHOCKLEY EQUATION, $$I_S = A\left(\frac{qD_p P_{no}}{L_p} + \frac{qD_n n_{po}}{L_n}\right)$$

AND THE CURRENT FLOWING THROUGH THE p-n JUNCTION DIODE IS GIVEN BY $$I = I_p + I_n = I_S \left(e^{\frac{qV}{nkT}} - \right)$$

WHERE, q IS THE CHARGE AMOUNT OF AN ELECTRON, D IS DIFFUSIVITY OF FREE CARRIERS, L IS DIFFUSION LENGTH OF FREE CARRIERS, p & n ARE DENSITIES FOR HOLES AND ELECTRONS, A IS THE p-n JUNCTION AREA, V IS THE BIASING VOLTAGE, k IS BOLTZMANN CONSTANT, AND T IS TEMPERATURE.

FIG.6(b)

$V_{on}$ = p-n JUNCTION DIODE FORWARD TURN-ON VOLTAGE, TYPICALLY 0.65v FOR Si IN ROOM TEMPERATURE, i.e., THE DRAIN JUNCTION TURN-ON VOLTAGE IN nMOSFET TRANSISTOR HERE.

$R_b$ & $R_c$ ARE BASE AND COLLECTOR RESISTANCES.

$V_{BR}$ = BREAKDOWN VOLTAGE OF THE DRAIN JUNCTION.

$V_{ce}(sat)$ = EMITTER-TO-COLLECTOR SATURATION VOLTAGE OF THE PARASITIC LATERAL npn TRANSISTOR OF THE nMOFSET ESD PROTECTION DEVICE.

$\beta$ IS THE CURRENT GAIN OF THE PARASITIC LATERAL npn OF THE nMOSFET DEVICE.

FIG.7(c)

PARAMETER CHECKING METHOD FOR ON-CHIP ESD PROTECTION CIRCUIT PHYSICAL DESIGN LAYOUT VERIFICATION

BACKGROUND OF THE INVENTION

Electrostatic discharge (ESD) induced damage is a devastating problem to integrated circuit (IC) parts. In order to protect IC parts against ESD failures, on-chip ESD protection circuits (hereinafter "ESD devices" for brevity) are required for virtually all practical IC products. On-chip ESD protection circuit design emerges as a major design challenge as IC technologies migrate into the very-deep-submicron (VDSM) regime, particularly for mixed-signal and RF ICs.

ESD events, which are inevitable in IC manufacturing, assembly, and application, generate huge over-current and over-voltage transients that can fatally damage electronic components. ESD failure becomes a major IC reliability problem to the semiconductor industry, and accounts for 30–50% of total field failures. Therefore, on-chip ESD devices are required for all IC chips. In principle, an ESD protection device, which remains in the off state in normal operation, is triggered by an ESD pulse to form a low-impedance discharging path to shunt the current transient safely and to clamp the pad voltage to a sufficiently low level, therefore protecting an IC chip from being ESD-damaged.

While many different kinds of general purpose IC physical design verification methods, such as design rule checking (DRC) and layout versus schematic (LVS) exist, few physical design verification methods and computer-aided-design (CAD) software tools are available for on-chip ESD protection circuit design. Particularly, no physical design verification method and CAD tool are currently available that can perform comprehensive ESD-function-based physical design verification at the design layout level without resorting to device-model-based schematic/simulation level checking.

In on-chip ESD protection circuit design, after layout and before IC fabrication, comprehensive physical layout design verification should be performed to thoroughly verify the layout design. Physical layout design verification helps to avoid fatal layout errors and reduce design time and efforts. Unfortunately, the currently dominating trial-and-error ESD protection approaches do not facilitate any practical ESD device design verification methods and software.

Aside from the challenges associated with the design of circuits for on-chip ESD devices, comprehensive ESD device design verification at the whole chip level becomes critical to the success of complex IC chip design. An automatic ESD device extractor at the layout level can play an important role in IC protection. ESD device extraction should be the first step in any design verification to enable further layout-schematic checking and ESD circuit simulation at the whole chip level.

Compared with the research efforts made in ESD device design, very limited work has been done in realizing ESD device extraction. The current challenges in developing ESD device extraction tools are as follow. First, extraction of ESD device is different from that of extracting normal IC devices in that ESD devices are often unconventional devices in nature. Conventional IC devices, such as MOSFET, can be extracted using basic Boolean operation of layout features as set forth in U. Lauther, "An O(N log N) Algorithm For Boolean Mask Operations", Proc. 18$^{th}$ DAC, pp 555–562, 1981. However, ESD devices have very complicated structures and irregular layout patterns which cannot be extracted using existing conventional device extractors.

Second, ESD transient current often causes the turn-on of parasitic ESD-like devices (also referred to herein as "ESD devices" for simplicity) such as may exist inside the protected core IC circuit or in the ESD protection network, before the intentional ESD devices can be triggered to perform ESD protection. The chip level. Therefore, there is a need for reliable parasitic ESD device extraction, and analysis according to the ESD stressing conditions.

In T. Li, C. Tsai, E. Rosenbaum and S. M. Kang, "Modeling, Extraction and Simulation of CMOS I/O Circuits under ESD Stress", Proc. IEEE ISCAS, Vol.6, pp 389–392, 1998., an ESD CAD tool is presented for detecting parasitic BJT (bipolar junction transistors) type ESD devices in MOSFET ESD protection structures under ESD stresses. In Q. Li and S. M. Kang "Technology Independent Arbitrary Device Extractor", Proc. 10$^{th}$ Great Lakes Symp. VLSI, pp 143–146, 2000., a technique to extract irregular ESD devices is presented. This technique, however, adopts a time-consuming top-down recognition approach, uses a redundancy-prone individual model graph recognition method, and mainly focuses on intentional ESD devices.

T. Li, Y. Hun and S. Kang, "Automated Extraction of Parasitic BJT's for CMOS I/O Circuits under ESD Stress", IRW Final Report, pp 103–109, 1997., presents an ESD-stress-dependent stress annotation technique to extract parasitic BJT devices. This technique does not have the desired capacity to extract any parasitic ESD devices independent of ESD stressing conditions, which is critical to verify ESD protection design at the full chip level.

An alternative device extraction technique is the procedural decision tree (D-tree) method reported in NCA/DVS Training Guide, NCA Corporation, California, USA. A D-tree is a structured set of sequential decisions used to refine an initial hypothesis formed when a characteristic layout feature to a specific device is found. In device recognition, the program detects a characteristic layout feature and goes through user-defined procedural D-tree routines to recognize a device. While simple to implement, the D-tree approach requires procedural details describing a device to be detected, thus increasing the amount of details that must be reprogrammed for each different IC technology. It also has the disadvantage of requiring a huge amount of intermediate mask/shape data. Hence, D-tree based extraction tools require complex device description, extensive computing time, and a large intermediate database.

Some reported device extractors such as in the aforementioned Li and Kang article, or in A. Brown and P. Thomas, "Goal-Oriented Subgraph Isomorphism Technique For IC Device Recognition" Comms., Speech & Vision, IEE Proc. I, V135 N6, pp 141–150, 1988., use a top-down approach in which a characteristic feature of a device is specified as the root for the device model graph, and the recognition of the device is triggered by the discovery of its root. This approach can be an efficient solution when a limited number of device types are considered. However, its efficiency decreases significantly as the number of model graphs is increased, as in the case of ESD protection circuit design.

However, an ESD device extractor should desirably deal with many device types including the classic ESD device types, e.g., ggNMOS (grounded-gate NMOSFET), gcN-MOS (gate-coupled NMOSFET), BJT, diode and SCR, as well as any new ESD devices, e.g., a dual-direction SCR ESD device as presented in A. Wang and C. Tsay, "On a Dual-Polarity On-Chip Electrostatic Discharge Device", *IEEE Tran. Electron Devices*, Vol. 48, No. 5, pp 978–984, May 2001.

Aside from the challenges associated with on-chip ESD device extraction, i.e., identification, an automatic ESD device layout extractor would desirably enable further layout-schematic checking and ESD circuit simulation at the whole chip level.

Q. Li, Y. Hun, J. Chen, P. Bendix and S. Kang, "ESD Design Rule Checker", *Proc. IEEE ISCAS*, pp 499–502, 2001., discusses an ESD design rule checking program, based upon the ESD device extraction tool proposed in the aforementioned Li and Kang article, that checks intentional ESD devices against given ESD design rules. This application may be limited by the features of the extraction tool of the aforementioned Li and Kang article.

S. Sinha, H. Swaminathan, G. Kadamati and C. Duvvury, "An Automatic Tool for Detecting ESD Design Errors", *Proc. EOS/ESD Symp.*, pp 208–217, 1998., reported an ESD design error-checking tool that performs simple and traditional metal bus resistance and diffusion spacing checks only.

M. Baird and R. Ida, "VerifyESD: A Tool for Efficient Circuit Level ESD Simulation of Mixed-Signal ICs", *Proc. EOS/ESD*, pp 465–469, 2000., presented an ESD device verification tool that is simply a SPICE (Simulation Program with Integrated Circuit Emphasis) pre/post processor capable of analyzing a given circuit netlist. This tool does not address complex ESD device extraction problems.

Further, while there have been proposed device extraction techniques for the identification of some ESD device structures, no tool or system known to the inventors has yet put forth a means for calculating the critical operating parameters of those ESD devices identified and using the critical operating parameters in order that a thorough, automatic, layout level design verification may take place for the whole IC chip to ensure that the IC is adequately protected from ESD events.

Therefore, what is needed in the art for proper IC design verification is reliable, complete, automatic, ESD device extraction and inspection method at the design layout level to ensure full ESD protection of ICs. It is also desirable that such a method should be CAD-based and that it should enable further layout-schematic checking and ESD circuit simulation at the whole chip level. It is also very desirable that the final output of the netlist of such a method should contain all ESD-type devices capable of being turned on under an ESD pulse, whether the devices are intentional ESD devices or parasitic (unintentional) ESD-like devices.

SUMMARY OF THE INVENTION

Although simple DRC checking is needed to check spacings between IC masks for various diffusion layers, dielectric layers and metal interconnect layers, very similar to the routine for ordinary IC circuits, it is not enough for complete ESD protection design verification. The unique properties of on-chip ESD protection circuits demand much more than a simple spacing check in order to perform thorough physical design verification.

Referring to FIG. 1, consider a typical current-voltage (I-V) characteristic for an ESD device. An ESD device operates as follows: under ESD stressing, the ESD protection unit is turned on at a triggering point $(V_{t1}, I_{t1})$. It is then driven into a snapback region featuring a holding threshold $(V_h, I_h)$ and forms a low-impedance $(R_{on})$ discharging path to shunt the ESD transients. Eventually, the ESD device may fail as it reaches the second breakdown (thermal breakdown) point $(V_{t2}, I_{t2})$. Hence, in order to successfully verify ESD protection design, the present invention can include these, and other, ESD-critical parameters in its ESD protection design verification procedure.

The present invention is able to extract all possible ESD elements, of any kind, e.g., intentional ESD devices or parasitic (unintentional) ESD-type devices (hereinafter collectively referred to as "ESD devices"), from the layout file. The present invention can then determine whether all intentional ESD devices are included in the layout design. The present invention can further analyze the parasitic ESD devices extracted to determine if they may cause pre-mature ESD failure.

Generally, the present invention provides a new, smart, parameter checking mechanism that can perform complete ESD protection circuit design verification at the design layout level. One function of the smart parameter checking routine of the present invention is to ensure that all intentionally designed ESD devices are designed correctly in physical layout and that no potential parasitic ESD devices cause malfunction in ESD protection operation at full chip level.

The present invention can provide CAD software which takes the IC layout data file as an input and automatically extracts all possible ESD devices. A new IC circuit schematic including all ESD-type devices is then generated. After extracting all possible ESD devices from layout, the present invention can automatically extract, or calculate, a group of critical performance parameters, sometimes referred to herein as "ESD-critical parameters", for the extracted ESD devices based on physical knowledge of the device structures. These ESD-critical performance parameters may include triggering voltage and current $(V_{t1}, I_{t1})$, holding voltage and current $(V_h, I_h)$, discharging impedance $(R_{on})$, current gain $(\beta)$, second breakdown (thermal) voltage and current $(V_{t2}, I_{t2})$, and parasitic resistance in the discharging path $(R_{on})$, etc. These ESD-critical parameters determine how the designed structures will operate under ESD stresses.

By utilizing the ESD-critical parameters, the present invention can provide both extraction and analysis of the IC design layout for intentional and (unintentional) parasitic-type ESD devices. That is, after ESD device identification, the identified devices should be analyzed and the results compared to the IC requirements to verify the protection design validity for the whole chip.

Generally, an ESD device extraction method according to aspects of the present invention may be implemented in three steps: First, known device definitions are read into a technology file and saved in a device model database. Second, the design layout data is saved into the layout database after necessary Preprocessing. Third, all the ESD devices, intentional and parasitic, are recognized in a device extraction engine. After extraction of all ESD devices, aspects of the present invention provide an ESD-critical parameter extraction engine to derive the critical performance parameters of the ESD devices and to check the extracted ESD devices with parametric and connectivity criteria in order to remove any non-critical ESD-type devices in order to reduce the necessary ESD device count and verify the validity of the ESD design layout. The final ESD device netlist and textual and graphic reports of the design layout verification may then be produced.

Because IC layout is a geometrical description of masks in a specific format, for example, GDSII or CIF format, conventional devices such as MOSFETs can be readily presented by a unique set of mask layers stacked on top of each other (vertical device). However, ESD devices usually have irregular structures and very complicated layout patterns, typically being lateral devices, e.g., the popular SCR (silicon controlled rectifier) and LVSCR (low voltage triggered SCR) ESD devices. These structures cannot be dealt with by existing traditional circuit extractors. Conventional device recognition methods based on Boolean operation of layout features is not capable of recognizing abnormal ESD devices. The present invention therefore uses a subgraph isomorphism technique to efficiently recognize the arbitrary geometry of ESD devices, for either vertical or lateral types.

For ESD device recognition using subgraph isomorphism, each device type is described by a unique device model graph (MG). The whole of the IC layout data is presented as a target graph (TG). An ESD device is then recognized by matching one fragment of the target graph with one of the device model graphs.

Another unique feature of ESD devices is that different ESD devices often share some common layer elements. Based upon the above observation, the present invention improves the efficiency of its ESD device extraction program by using a new device recognition algorithm based on a decomposition approach. The reader is referred to B. Messmer and H. Bunke, "Efficient Subgraph Isomorphism Detection: A Decomposition Approach", *IEEE Trans. Knowledge and Data Engineering*, Vol. 12, No. 2, pp 307–323, March/April 2000., for general information on decomposition technology.

Unlike a top-down approach, which handles each model graph individually, an algorithm according to the present invention may first explore the relationship between the device model graphs by a decomposition procedure. The common part of any two or more model graphs will only be matched for similarity once, which makes the device recognition procedure less heavily dependent upon the number of device model graphs than is the top-down approach. Further, according to certain aspects of the present invention, model containment relationships can be explicitly expressed, e.g., a small redundant ESD device contained in a larger ESD device can be easily removed from the final ESD device netlist. This eliminates the necessity of developing an individual redundant device processor and improves computing time efficiency for ESD device recognition.

The present invention can then perform a full chip level ESD protection physical design check. The present invention can determine if all the intentionally designed ESD devices exist in the extracted ESD protection circuit schematic. The present invention can extract the ESD-critical parameters of an ESD device based upon the approximate device physics equations for the specific ESD protection structures and given layout data. Then the present invention can perform a smart parameter checking routine which can verify the functionality of the intentionally designed ESD devices.

Since parasitic ESD devices may lead to ESD protection failure, all the extracted possible parasitic ESD devices may be examined to ensure that they will not cause any ESD protection malfunction (early ESD failure). To determine whether any of the parasitic ESD devices may cause ESD protection malfunction, the present invention may compare their triggering voltages, discharging resistances, or other ESD-critical parameters, e.g., critical parameters such as, $(V_{t1}, I_{t1})$, $(V_h, I_h)$, $R_{on}$, $\beta$, and $(V_{t2}, I_{t2})$, etc, as necessary to determine that the parasitic ESD devices will not interfere with the designed ESD devices and cause ESD protection malfunction.

If the present invention confirms that all the intentionally designed ESD devices do exist in the layout and that there are no parasitic ESD devices that might cause ESD protection malfunction, it can proceed to verify the performance of the desired ESD devices.

Briefly, the smart parameter checking routines in the present invention can conduct at least the following: The extracted triggering voltage $(V_{t1})$ will be checked first. If $V_{t1}$ is lower than the pre-set triggering voltage value, it will cause short-circuit and the design is faulty. The extracted holding voltage $(V_h)$ can then be checked to make sure it is low enough to clamp the pad voltage to a sufficiently low level to avoid any dielectric rupture, i.e., lower than the dielectric breakdown voltage of the IC device in direct connection with the pad. For example, if connected to the gate of CMOS, $V_h < BV_G$, the gate breakdown voltage, is required.

The extracted thermal breakdown voltage $(V_{t2})$ can be checked next to make sure that $V_{t2} > V_{t1}$ if a multi-finger ESD device is used in order to ensure uniform triggering of all the device fingers. The extracted thermal breakdown current $(I_{t2})$ can then be used to estimate the potential ESD protection level. For example, using the human body model (HBM), the ESD protection level can be estimated as $\approx 1500\Omega * I_{t2}$ in units of Volts. If this value meets the design target, the layout design may be considered successful. Otherwise, one may have to redesign the ESD protection circuit accordingly. The extracted parasitic series resistance (R) and current gain (D) are needed to estimate ESD-critical parameters, $V_{t1}$, $I_{t1}$, $V_h$, $I_h$, $R_{on}$, $V_{t2}$, $I_{t2}$, etc, according to semiconductor device physics equations for the type of ESD devices in use.

Completion of the above checking flow means that the smart parameter checking method for ESD device physical design verification can not only perform simple layout spacing checking, but is also able to perform comprehensive electrical behavior checking which is critical to judging ESD protection circuit functions. The smart parameter checking method not only applies to the ESD-critical parameters discussed above, but also works for other relevant ESD-critical terminal parameters in general. For example, for a silicon-controlled rectifier (SCR) ESD-type structure, the β-product of the $\beta_{npn}$ of the NPN transistor and $\beta_{pnp}$ of the PNP transistor may be checked among extracted SCR ESD-type devices.

CAD software implementing this new smart parameter checking method have been developed. Thus, the present invention can automatically extract all kinds of ESD devices and their associated ESD-critical parameters. It can also generate extracted ESD protection circuit schematics and perform the detailed smart parameter checking routines to verify the ESD protection circuit physical layout design as well as generate text and graphic report verifications and a net list.

BRIEF DESCRIPTION OF THE DRAWINGS

FIG. 5(a) shows model graphs for LVSCR and FIG. 5(b) shows ggNMOS, FIG. 5(c) shows decomposition results showing that the subgraphs of the NMOS are shared by the LVSCR.

FIGS. 6(a) and 6(b) illustrate ESD-critical parameter extraction for a simple diode ESD device.

FIGS. 7(a), 7(b) and 7(c) illustrate ESD-critical parameter extraction for a ggNMOS ESD device.

DETAILED DESCRIPTION OF THE PRESENT INVENTION

Figure 1:
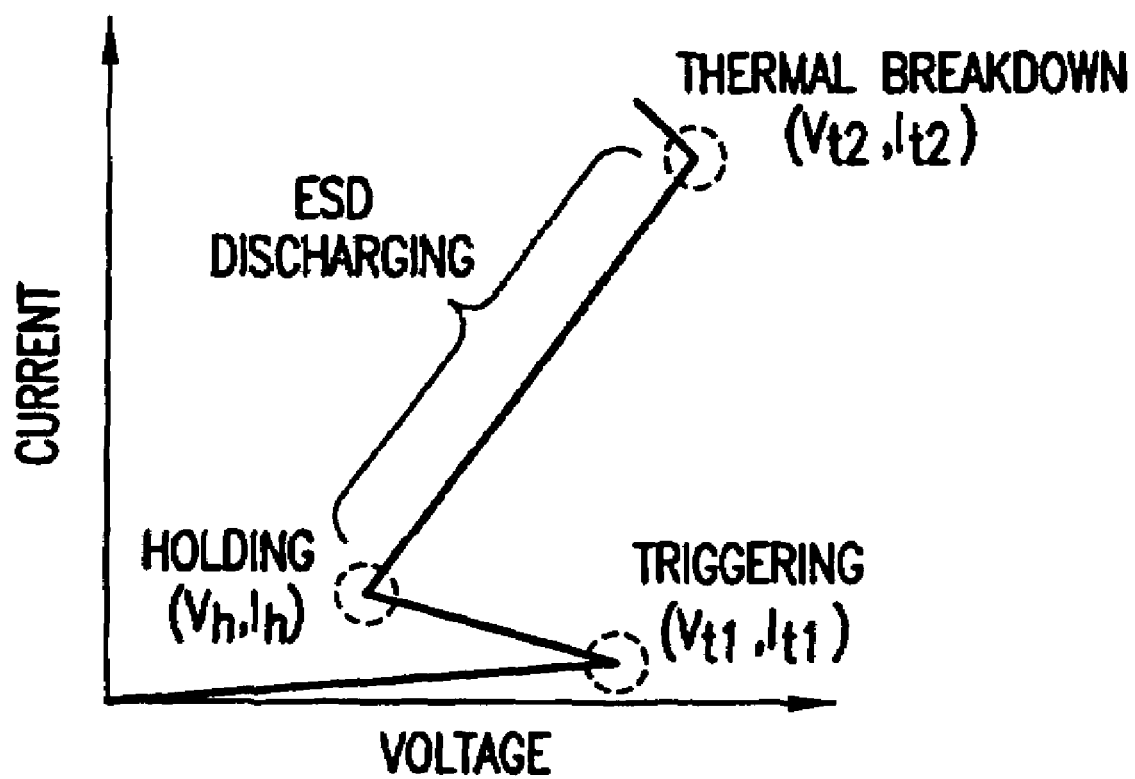
FIG. 1 is a graph of a typical snapback I-V characteristics for an ESD device.
Figure 2:
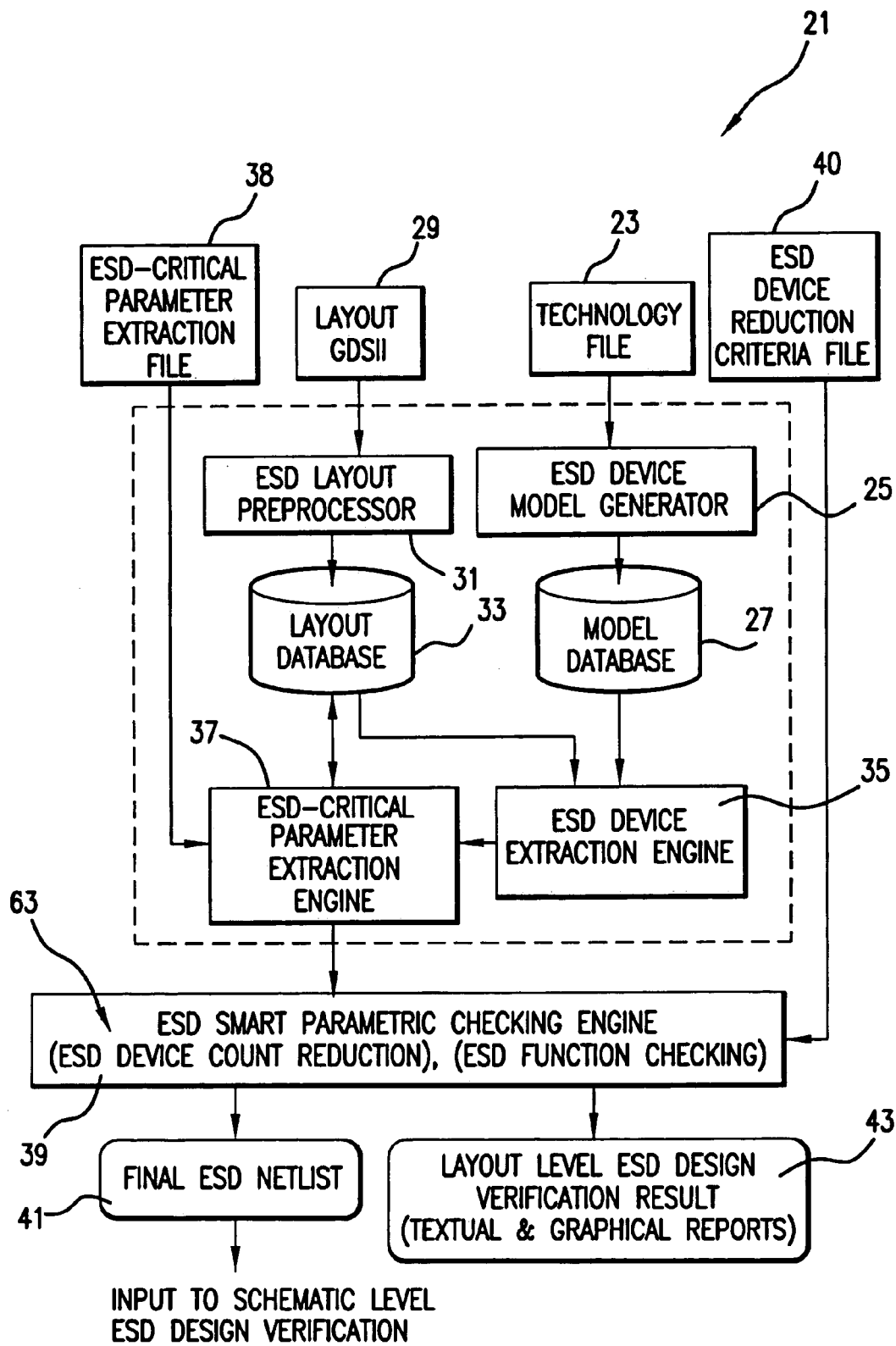
FIG. 2 is a block diagram of a verification system and method according to aspects of the present invention

Referencing FIG. 2, a system or method according to the present invention provides extraction and analysis of arbitrary ESD-type devices of any format for both intentional and parasitic ESD-type devices. Generally, an ESD device design layout verification method according to aspects of the present invention may be implemented in six steps. First, a known ESD device definition contained in an ESD technology file 23 is read into the ESD device model generator 25, as further discussed below, and the device model is saved in the model database 27. Second, the IC layout data 29 is saved into the layout database 33 after necessary Preprocessing 31. Third, all the ESD-type devices, intentional or parasitic, are recognized, i.e., extracted or identified, by the ESD device extraction engine 35. Fourth, the critical parameters are calculated for the extracted ESD devices in the parameter extraction engine 37 from device physics equations contained in an ESD critical parameter extraction file 38. Fifth, the extracted ESD devices are checked with parametric and connectivity criteria in the checking engine 39 in order to remove any non-critical ESD-type devices and reduce the count for the list of necessary devices based on comparison rules contained in an ESD device Reduction Criteria File 40. Sixth, the final netlist of ESD devices 41 and the results of the layout verification 43 are reported.

Device Extraction/Identification

In certain aspects of the present invention, the device model generator 25, to avoid using computationally more expensive geometrical relationships/operations (e.g., include, intersect, surround, divide, etc) in device definition, will first merge together all the input geometries for all mask layer, then partition them into non-overlapping regions, i.e., various geometries formed by combined mask layers, where each non-overlapping region may be an overlapping set of multiple mask layers depending upon the specific device structure.

In one device definition implementation, each region is a simple polygon (i.e., a non-self-intersecting polygon) consisting of a set of stacked mask layers, where the presence and absence of mask layers are described in the program as a bit mask code word, called mask values, with a "1" of a mask layer representing the presence of that layer and a "0" indicating the absence of the mask layer. Hence, a mask value code of all "0's" represents the bare wafer substrate without any add-on IC physical layers. After this preprocessing, simple geometrical adjacency relationship/operation can be used for device definition.

The exemplary implementation adopts a non-root graph (i.e., a non-characteristic-feature approach) for device model graph definition, unlike the existing top-down approaches discussed above. The structure of a model graph is defined as model graph (N, R). The attribute N is a set of vertices with each vertex corresponding to a non-overlapping region with a specific mask value code word. The attribute R is a set of relationships between two different vertices of the device model, which, for ESD protection application, includes geometrical adjacency relationship R1 and electrical connectivity relationship R2. Hence, a complete set of vertices form a device model, model graph (MG).

Figure 3A:
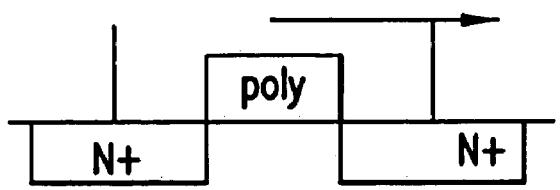
FIG. 3 illustrates a common ggNMOS ESD device: (a) cross-section (b) layout, (c) its model graph illustration.
Figure 3B:
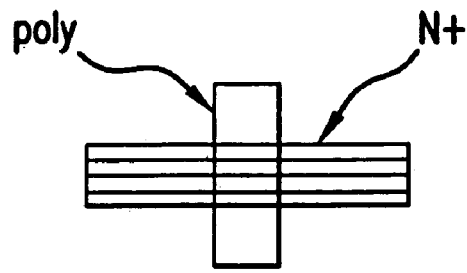
Figure 3C:
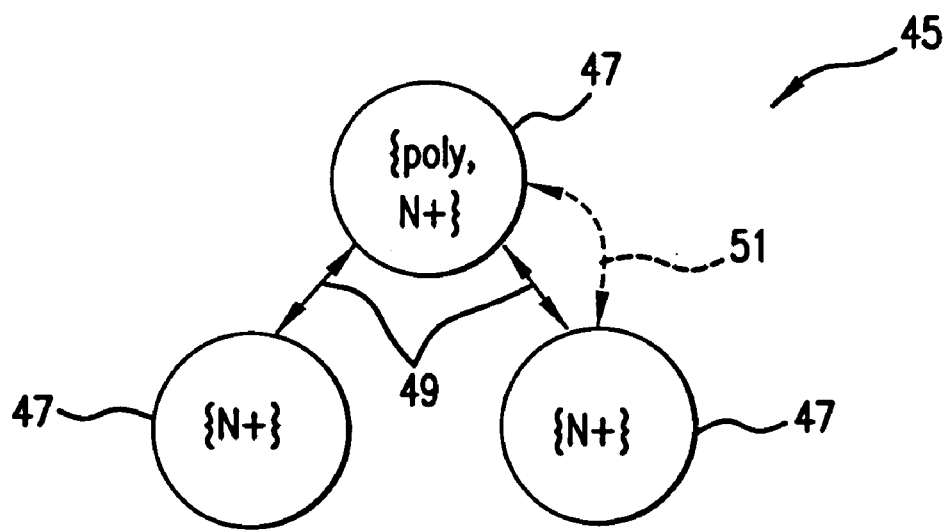

FIG. 3(c), illustrates a model graph 45 for a simple ESD device, ggNMOS, shown schematically in FIG. 3(a) and in mask structure in FIG. 3(b), where each circle 47 represents a vertex of the model graph, the solid lines 49 represent geometrical adjacency relationship R1 and the dashed line 51 represents electrical connectivity R2. For illustration purposes, the attributes in the vertex circles are not described by binary code words as they would be in the program. Instead, the physical layer names are used to indicate the presence/absence of specific mask layers with the appearance of a layer name indicating a "1" for its mask value in the codes.

Figure 4A:
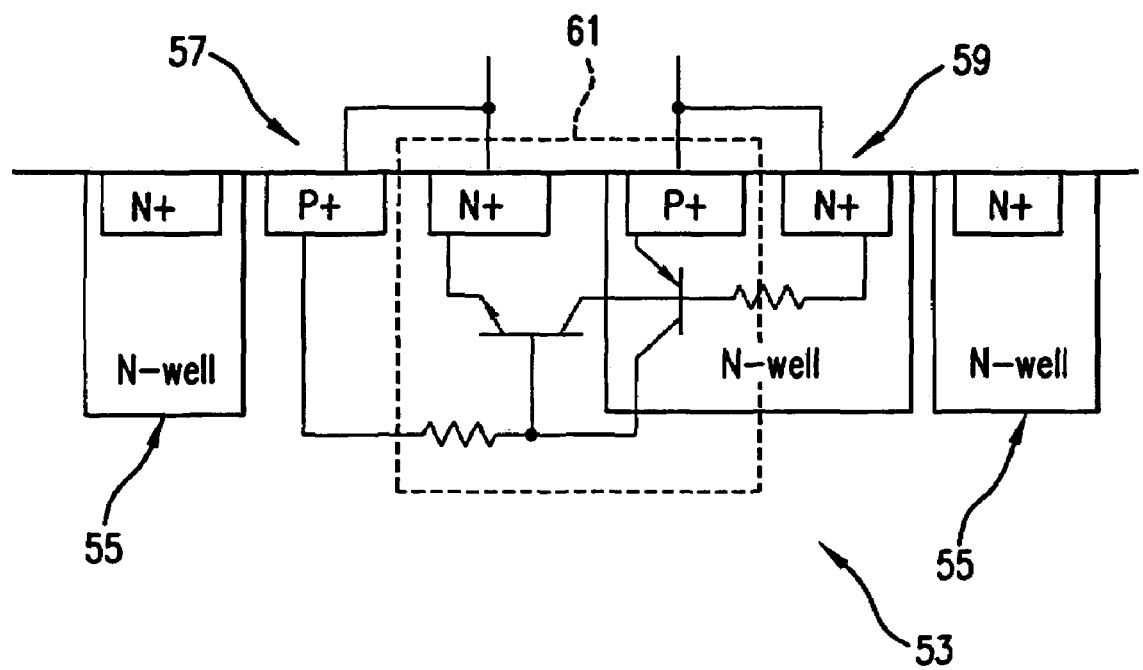
FIG. 4(a) illustrates an intentional SCR ESD device by design in cross-section.
Figure 4B:
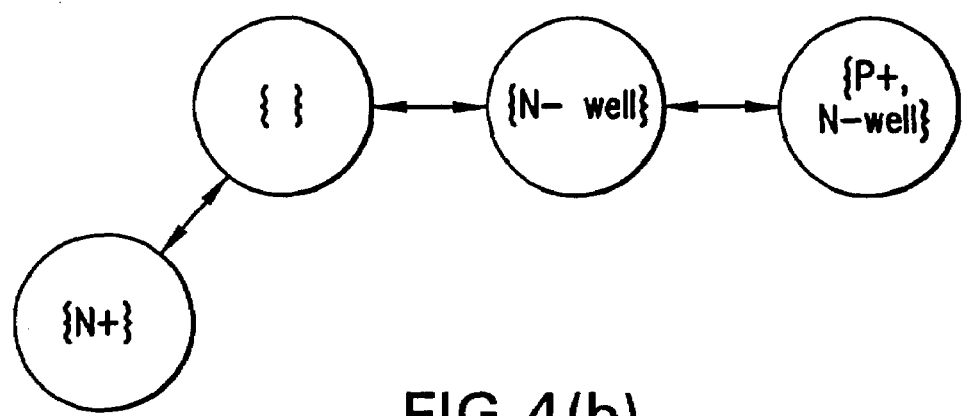
FIG. 4(b) illustrates the generic SCR model graph defined in the system of the present invention.

The device extraction engine 35 (FIG. 2) will extract all intentional and parasitic ESD-type devices. Intentional ESD devices often obey strict layout design rules and utilize known or defined mechanisms to accelerate their triggering procedure or to isolate them from the protected IC core circuit. FIG. 4(a) illustrates a cross section of an intentional SCR ESD device featuring an isolation guard-ring 55 and pick-ups 57, 59. However, a parasitic ESD-type SCR device can be geometrically irregular in layout without guard-ring and pick-ups. Accordingly, the subcircuit part in dashed box 61 in FIG. 4a is picked out for the generic model graph for the ESD protection SCR, as shown in FIG. 4(b). This SCR model graph definition ensures that no parasitic ESD-type SCR devices will be missed.

This definition approach may lead to some redundant ESD-type devices being extracted. However, a device count reduction module 63, FIG. 2, will further analyze all the parasitic ESD devices extracted and remove any non-critical ones, as further discussed below. In the verification system 21, the device model generator 25 can automatically be invoked to read in the device model definition from the technology file 23 during the system start-up in order to generate corresponding inner data structures and to save them in the model database 27.

Necessary Preprocessing for Device Recognition

Referring again to FIG. 2, to prepare for device recognition, a pre-processor 31 transforms a layout file 29, e.g., an input GDSII layout file, into a target (layout) graph format which is stored in the layout database 33. A target graph (TG) consists of a finite set of vertices, where each vertex corresponds to a non-overlapping region and a set of edges joining the vertices with each edge representing an adjacency relationship existing between a pair of the vertices. A scanline algorithm as discussed in the above-mentioned Lauther article is used in the exemplary implementation.

Efficient Device Extraction Algorithm Based on Decomposition Approach

The device extraction algorithm for ESD device extraction engine 35 is realized in two stages. First, during the booting of system 21, the different device model graphs within model database 27 are recursively decomposed and the decomposition results, or decomposition model D(M), are represented and saved by an inner data structure as described in the following codes in algorithms 1 and 2 in the Decomposition explanation below. Second, during the extraction stage, the target layout graph, or TG, contained within the layout database 33, is matched with the D(M) in the ESD device extraction engine 35. As described earlier, when a device model $MG_1$ is contained by another device model $MG_2$, i.e., a smaller device contained by a larger one, the redundant device corresponding to $MG_1$ should be eliminated from the final result.

In the device extraction algorithm, the decomposition procedure is also conducted based on the subgraph isomorphism technique. Thus, the model containment relationship can be explicitly expressed in D(M), which makes the redundant device checking complete during the device recognition procedure. This eliminates the need for a redundant device post-processor, as may be a necessity in known practices.

In the following discussion, the decomposition stage of the model graphs is described and an example will be given. Then, the efficient subgraph isomorphism detection algorithm is presented.

Decomposition of the Model Graphs

Let $M=\{MG_1, \ldots, MG_N\}$ be a set of device model graphs. The decomposition result of M, D(M), is a finite set of extended graph EG(G, lG, rG, E, ifModel, ifCheck), where
1. G, lG, rG are graphs; lG is left subgraph of G; rG is right subgraph of G;
2. E is a set of edges existing between lG and rG to construct G;
3. ifModel is a Boolean variable. If ifModel=true, G is corresponding to a device model;
4. ifcheck is a Boolean variable. If ifCheck=true, G may contain another model graph, directly or indirectly.

The decomposition stage consists of the following steps:

---
Algorithm 1. (Model Decomposition)
---
1. LetD(M) = Null
2. For i=1 to N do //N is the number of MGs
   Create a new EG(G, lG, rG, E, ifModel, ifCheck),
   If i=1   //first MG to be decomposed ---
-continued Algorithm 1. (Model Decomposition)
---
   For this newly created EG do
     Let G=$MG_i$, ifModel = true, ifCheck = false
       Partition vertices in G into two parts and assign them to lG and rG respectively
       While (number of vertices in lG>1) do
         Partition lG until individual vertices reached
       While (number of vertices in rG>1) do
         Partition rG until individual vertices reached
   End for
  Else  //if not the first MG
   For this newly created EG do
     Detect D(M) and return Smax, the largest subgraph of $MG_i$ in D(M)
       If Smax.ifModel = true or Smax.ifCheck = true
       //Smax contains another MG, directly or indirectly
         ifCheck = true
       Else
         ifCheck = false
       End if
       Let lG = Smax, rG = $MG_i$-Smax
       While (number of vertices in rG>1) do
         Partition rG until individual vertices reached
       End for
   End if
     Add this newly created EG in D(M)
End for

---

Figure 5A:
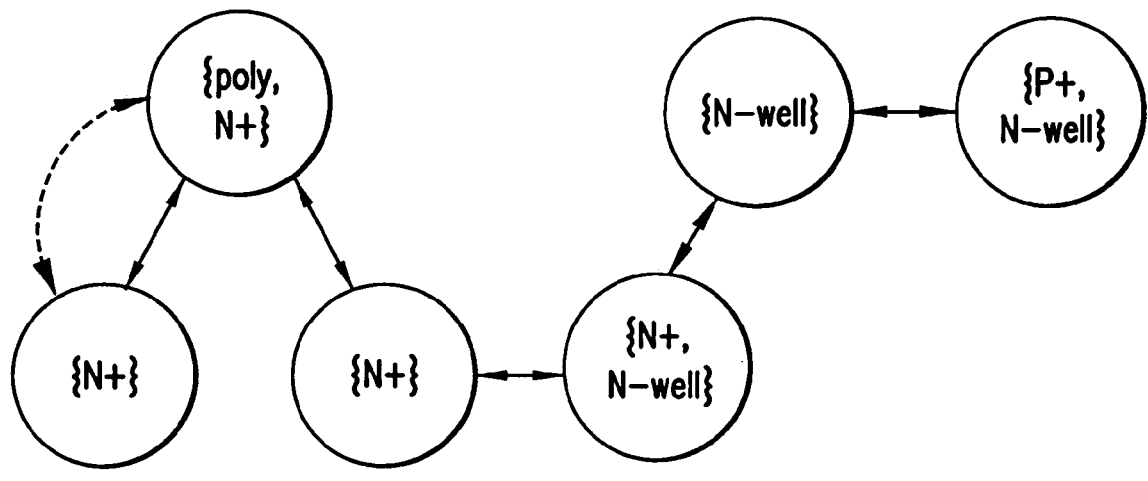
FIGS. 5(a), 5(b) and 5(c) illustrate device model graphs and decomposition procedures in a device extractor engine of the present invention.
Figure 5B:
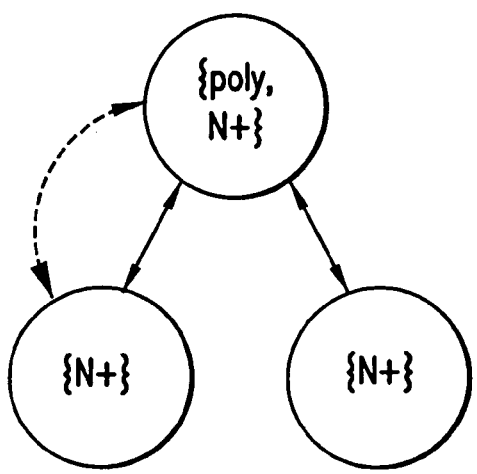
Figure 5C:
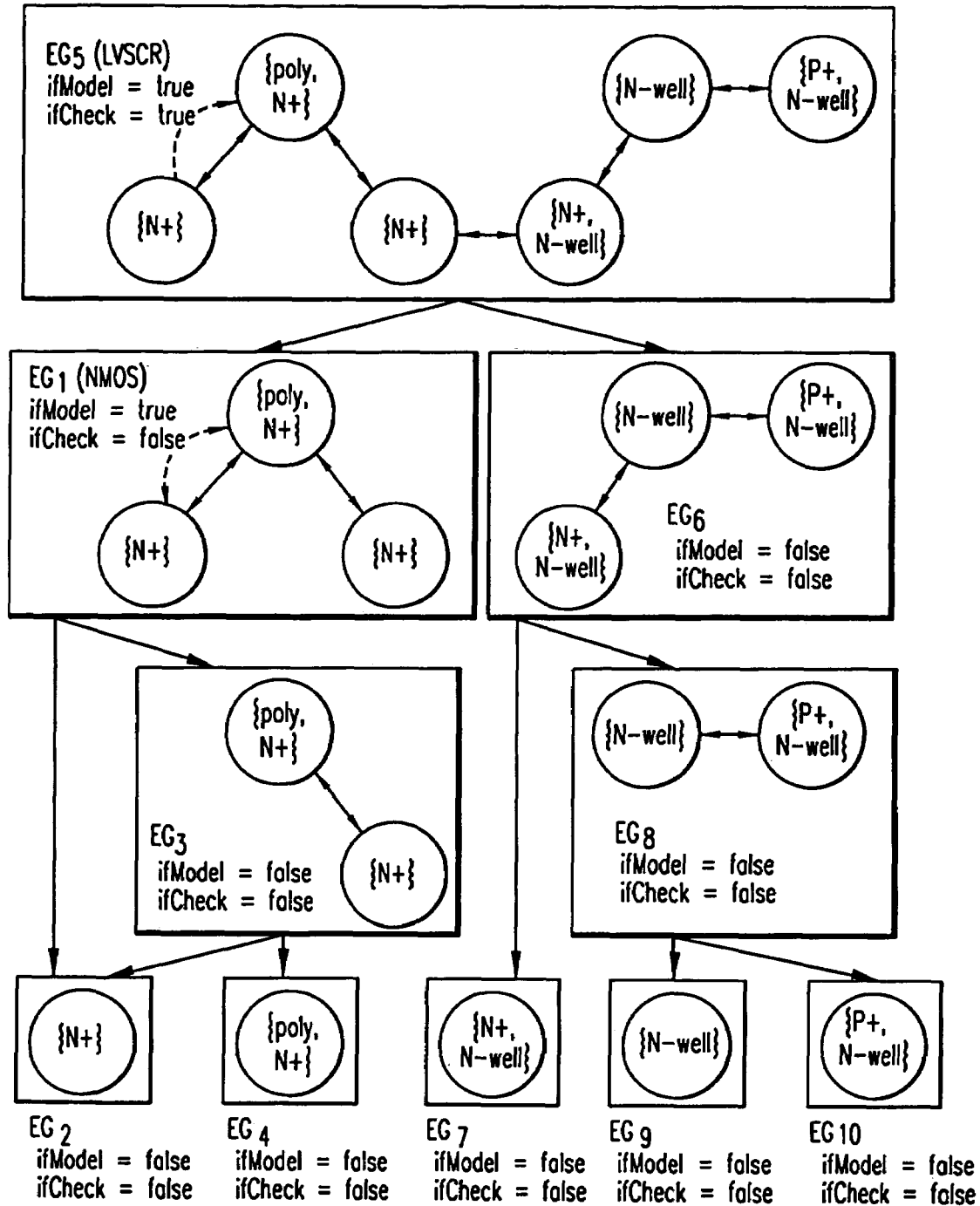

Referencing FIG. 5a and FIG. 5b, there are illustrated the model graphs for a LVSCR ESD device and a ggNMOS ESD device, respectively. Let model graph $MG_1$=ggNMOS and model graph $MG_2$=LVSCR. The decomposition results, $EG_1 \sim EG_{10}$, labeled according to the generation sequence, in D(M), are shown in FIG. 5(c). As can be seen, the ggNMOS EG, is first decomposed into two parts, with the left subgraph, lG, being EG2 ({N+}) and the right subgraph, rG, being $EG_3$ ({Poly, N+} and {N+}). Because the lG contains only one vertex, it will not be decomposed further. The rG, $EG_3$, will be further decomposed into two parts. The decomposition results of the ggNMOS, i.e., a set of EG, are saved in D(M) as $EG_1 \sim EG_4$.

For the LVSCR, the largest subgraph of its model graph in D(M), named Smax, a new definition for the largest D(M), is first searched in D(M) whose contents are now $EG_1 \sim EG_4$, and the result is $EG_1$ (ggNMOS). Then the LVSCR ($EG_5$) will be decomposed into two parts, with lG to be $EG_1$ (ggNMOS) and the rG, labeled as $EG_6$, to be the subtraction result of LVSCR by ggNMOS, i.e., (LVSCR)-(ggNMOS). Next, the algorithm will only need to further decompose the right subgraph of LVSCR, $EG_6$, which results in $EG_7 \sim EG_{10}$. From FIG. 5(c), we also observe that the common fragment subgraph, ggNMOS in this case, shared by two model graphs is saved only once in a D(M). In addition, for the LVSCR ($EG_5$), ifCheck=true ensures redundant device removal in the recognition stage.

Device Recognition and Redundant Device Removal Based on Decomposition Results Instead of matching each model graph individually onto a given target graph, the recognition algorithm first finds all occurrences of the individual vertices of the models within the target graph. These occurrences are then merged into larger subgraphs until the level of a complete model graph is reached. The procedure for device recognition and redundant device removal is given as the following.

Algorithm 2. (Device Recognition)
1. For each EG(G, lG, rG, E, ifModel, ifcheck) in D(M) from individual vertex to MG do
   Mark that EG to be unsolved.
   End for
2. Check every vertex of TG, if it is matched with a vertex in D(M), then a subgraph isomorphism has been found, and the corresponding EG, which contains only one vertex in the D(M), is marked alive. All other EGs having one vertex are marked dead.
3. For every EG in D(M)
   If this EG is marked unsolved and its lG and rG are marked alive do
   If a pair of subgraph isomorphism of lG and rG in TG can be merged to be a subgraph isomorphism of G do
   Create an association between G and subgraph isomorphism of G in TG
   If ifCheck=true and ifmodel=true do //G is corresponding to a MG and contains other small MG(s) directly or indirectly
   Find the contained small devices by searching subgraph isomorphism of lG and rG, and delete them
   End if
   End if
   Mark EG to be alive
   Else
   Mark EG to be dead
   End if
   End for
4. All subgraph isomorphism that have been found for MGs represented by D(M) are instances of ESD devices.

Parameter Extraction Functions

One must then extract the relevant ESD-critical parameters discussed previously to perform the smart parameter checking. This operating parameter extraction is performed by the ESD device critical parameter extraction engine whose outputs can be the ESD-critical parameters given before, i.e., $V_{t1}$, $I_{t1}$, $V_h$, $I_h$, $R_{ON}$, $V_{t2}$, $I_{t2}$, $\beta$ and $\beta_{NPN}\beta_{PNP}$, etc, depending upon the type of ESD protection devices involved.

Figure 7A:
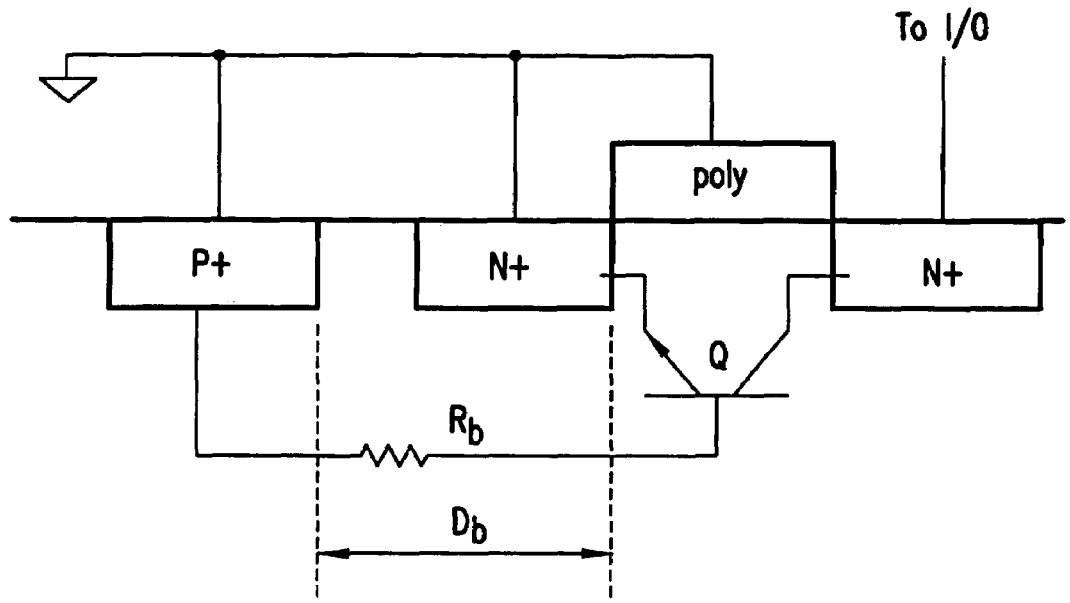
Figure 7B:
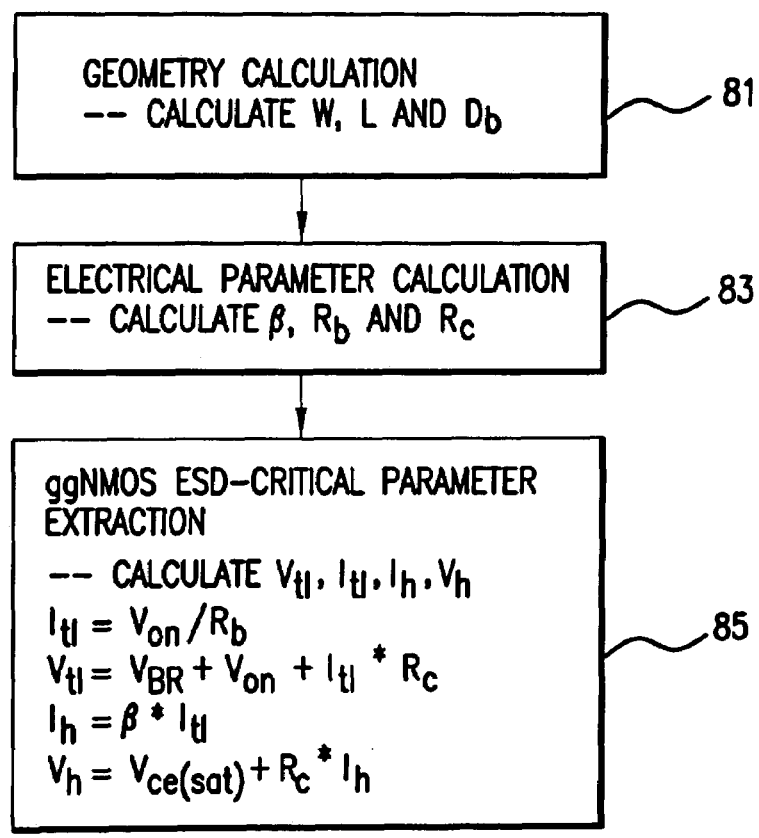

These ESD-critical parameters are extracted based upon the approximate device physics equations. For example, collector and base resistances and current capacities may be derived for the various device layout dimensions and known structures of the devices and used to extract the ESD-critical parameters. The basic device physics equations and terms that are the starting points of the extraction equations of FIGS. 6(a) & 7(b) are listed in FIGS. 6(b) and FIG. 7(c) for the specific ESD protection structures and given layout data. While there are provided descriptions for this parameter extraction procedure using some common ESD devices as examples, extraction of critical parameters for other ESD devices will be assumed to be within the ordinary skill of the art upon gaining a thorough understanding of the present invention. Referring to FIG. 6(a), in the case of using a diode as an ESD protection device, which features a simple turn-on I-V characteristic, its typical ESD-critical parameters can be described by approximate device physics equations given in FIG. 6(a), starting with a calculation of IS, which is a constant current term in a pn junction diode as given in the well-known Shockley equation for a pn junction diode. FIG. 6(b) illustrates the basic device physics equations for a pn junction diode (see W. Shockley, "The theory of p-n junctions in semiconductors and p-n junction transistors", *Bell Syst. Tech. J.*, 28, 435 (1949)). Referring to FIGS. 7(a) and 7(b), there is shown the cross-section and ESD-critical parameter approximation formulas, respectively, of a well-accepted grounded-gate MOSFET (ggNMOS) ESD protection structure featuring the snapback I-V characteristic. Referencing FIG. 7(b), after a device geometry calculation 81 of W (ESD-device Width), L (MOSFET channel Length) and distance Db (the distance between the edges of poly gate and body pick-up, shown in the FIG. 7(a)), and electrical parameter calculation 83 of gain, base resistance $R_b$, and collector resistance $R_c$ based upon device construction, will enable critical parameter extraction 85 of $V_{t1}$, $I_{t1}$, $I_h$, $V_h$, etc. FIG. 7(c) gives the basic device physics terms for MOSFET transistors. Sufficient accuracy of extracting these typical ESD-critical parameters has been verified from known designs implemented in several commercial CMOS/BiCMOS IC technologies.

Device Count Reduction Module

Numerous parasitic ESD-like devices may be extracted from a layout file, of which only a handful might be relevant to actual ESD protection operation. Therefore, a device count reduction module 63, FIG. 2, is necessary, which will be conducted based upon the smart parameter checking mechanism. Briefly, the following can considered in the smart parameter checking: First, ESD-critical parameters, e.g., gain, triggering voltages, discharging on-resistance, etc., ($V_{t1}$, $I_{t1}$, $V_h$, $I_h$, $R_{on}$, $V_{t2}$, $I_{t2}$, and $\beta$), are extracted as terminal parameters for all extracted ESD-type devices. Second, proper criteria are pre-set by designers for these terminal ESD parameters. Third, smart parameter checking is performed for the new ESD netlist generated in device extraction to remove any redundant ESD-type devices extracted.

For example, assume two ESD devices, A and B, that are extracted from the layout are connected in parallel. If device A has a much higher trigger voltage than B does, A will be removed since it will never have a chance to discharge an ESD pulse. Or, if device A and B have equivalent trigger voltages, meaning they are able to turn on simultaneously, but device A has much less on-resistance than B does, then B will be removed from the ESD device list since A will take all the ESD transient.

This smart parameter checking approach is a major improvement over existing methods where device count reductions are based upon layout dimension only. Generally, the accuracy of the proposed device count reduction module depends upon the completeness of the criteria defined, which, in turn, relies on the collection of real-world design data.

Smart Parameter Checking Mechanism

Functionality-based layout design checking requires the extraction, i.e. calculation, or identification, of ESD-critical parameters, which can be a concise but quantitative parameter matrix that describes basic ESD protection operation. These ESD-critical parameters should include such important ESD operational features as triggering threshold ($V_{t1}$, $I_{t1}$), holding point ($V_h$, $I_h$), discharging impedance ($R_{ON}$), failure threshold ($V_{t2}$, $I_{t2}$), etc. Typically, $V_{t1}$ is designed to ensure proper turn-on of an ESD protection structure upon an ESD pulse without causing any short-circuit problem in normal IC operation. It, is a good indicator to leakage current introduced by the ESD protection structure. $V_h$ determines the pad voltage clamping level that should be lower than any related breakdown voltage. $I_h$ is important to avoid past-ESD latch-up problem in design. $I_{t2}$ is commonly accepted as a good indicator of ESD protection level, i.e., the maximum ESD current handling capacity. $V_{t2}$ is typically set as $V_{t2} > V_{t1}$ in a multi-finger MOS ESD protection structures to ensure uniform turn-on across the fingers. In addition to these universal parameters, a few structure-specific parameters should also be addressed.

For example, for BJT and FET based ESD protection structures, the effective current gain, β, can be an ESD-critical parameter because it determines the efficiency of the BJT function, the fundamental ESD protection mechanism in these structures. β is also the main factor determining the $R_{ON}$ of these ESD protection structures. For a SRC type ESD protection structure, the β-product, i.e., $\beta_{NPN}\beta_{PNP}$, of its parasitic NPN and PNP BJTs is clearly an ESD-critical parameter because it determines not only the SRC $V_{t1}$, but also its effective $R_{ON}$, hence the ESD protection efficiency of the SRC.

An efficient and reliable ESD layout verification method according to the present invention may perform traditional layer spacing and path resistance checking, as well as ESD-critical parameter checking. Thus, the present invention can include both the traditional DRC-type spacing checking and ESD-function-based ESD-critical parameter matrix checking, thereby providing an ESD physical design verification procedure at the whole chip level. While traditional DRC-type ESD design checking can verify general ESD design rule compliance, it is only the first and minor step toward full-chip layout design verification. Besides the fact that there are normally no reliable ESD design rules available for an IC technology, success of ESD protection design depends completely on the whole IC chip where mutual interactions between the ESD protection network and the core circuit being protected play key roles.

Aspects of the smart parameter checking method of the present invention can be understood from the following typical ESD design layout case descriptions:

In Case 1, the present invention checks the extracted ESD netlist to see if all intentional ESD devices are there. If any intentional ESD devices are missing, the layout has an error.

In Case 2, the present invention checks all the ESD-critical parameters against the ESD design specifications including $V_{t1}$, $I_{t1}$, $V_h$, $I_h$, $R_{ON}$, $V_{t2}$, $I_{t2}$, β, etc. If any intentional ESD devices do not meet the design specs, the design is faulty.

Next the present invention considers the parasitic ESD devices extracted, in Case 3, assuming two extracted ESD devices, A and B, are connected in parallel. A is a parasitic ESD device and B is the intentional ESD device. If A has a sufficiently higher triggering voltage, $V_{t1}$, than B does, then A is not a parasitic device of any concern and can be removed from the ESD netlist since it would never have a chance to be turned on by an ESD pulse.

In Case 4, if two extracted ESD devices, A (parasitic) and B (intentional), are in parallel connection and have comparable $V_{t1}$, meaning both may be triggered at the same time by an ESD pulse, then neither A nor B can be removed from the netlist. The present invention then proceeds to check the discharging impedance $R_{ON}$. If $R_{ON}$ of A is sufficiently larger than that of B, then ESD current will discharge into device B, while the parasitic device A is not a design concern and can be removed.

In Case 5, assume the ESD devices A and B have comparable $V_{t1}$ and $R_{ON}$. Hence, both would conduct under ESD stresses, and the present invention will check their holding voltages $V_h$. The lower $V_h$ will determine the pad voltage clamping behavior. If the lower $V_h$ is higher than the maximum acceptable pad voltage specification, the design is faulty.

In Case 6, suppose the parasitic ESD device A discharges the majority of the ESD pulse. To determine if there will be any pre-mature ESD failure occurrences in A, the present invention will check the failure threshold $I_{t2}$. If $I_{t2}$ of device A indicates an ESD protection level substantially lower than the design specification, one would expect an early ESD failure due to internal parasitic ESD-type structure and the design is faulty. Otherwise, even though device A is a parasitic ESD-type element, it is not a design concern in terms of ESD protection performance. These special Cases represent some common ESD protection design situations.

In reality, more ESD protection operations may need to be considered in the smart parametric checking routines. For example, in a case where two extracted ESD-type devices, A and B, are in series connection, the total series triggering voltage, $V_{t1}$, can be estimated first, then compared with any existing parallel ESD structure for a possible ESD discharging pattern. Implementation of the present invention may further include defining a group of relevant ESD-critical parameter related checking criteria as discussed below, typically assuming the case of two parallel ESD devices, A and B, unless otherwise noted.

1. β-product criterion

If device A is an SCR-type ESD device and its β-product is less than 1, then A has no chance to be turned on by an ESD pulse and will be removed.

2. Triggering point criteria

2a. Maximum $V_{t1}$ criterion

If $V_{t1}$ of the device A is substantially higher than a given threshold voltage $V_{t1\text{-}max}$, pre-set for a specific ESD protection circuitry, then ESD device A cannot be turned on by an ESD pulse and will be removed. Typically, upon the inventors' experience, a "substantial" difference means a ~10%+ difference in the values used here, which generally applies to all other value comparisons in the smart parametric checking procedures.

2b. $V_{t1}$ calculation criterion

If ESD devices A and B are connected in series, the total triggering voltage of the combined A+B ESD network is the sum of $V_{t1}$ of A and B.

2c. $V_{t1}$ comparison criterion

If ESD devices A and B are connected in parallel and device A has a substantially higher $V_{t1}$ than B does, then ESD element A will be removed.

3. Holding point criteria

3a. Maximum $V_h$ criterion

If ESD device A has a holding voltage, $V_h$, substantially higher than a given holding voltage $V_{h\text{-}max}$ pre-set for the specific ESD protection circuitry, then device A cannot provide the sufficiently low pad voltage clamping under ESD stress and a faulty design is determined.

3b. $V_h$ comparison criterion

If ESD devices A and B are connected in parallel and A has a substantially higher $V_h$ than B does while device A is the main ESD discharging device, then a faulty design is determined.

4. $R_{ON}$ criteria

4a. Maximum RON criterion

If ESD device A has an effective ESD discharging impedance RON substantially higher than a given $R_{ON\text{-}max}$ which is pre-set for the specific ESD protection structure, then device A cannot handle the amount of ESD transient current required for a specific ESD protection level and will cause early ESD failure due to resistive over-heating. Hence, a faulty ESD protection design is determined.

4b. $R_{on}$ comparison criterion

If ESD devices A and B, with comparable $V_{t1}$, are connected in parallel and device A has a substantially larger $R_{on}$ than B does, then device A should not play any role in discharging ESD pulse and will be removed.

5. ESD failure threshold criteria

5a. Minimum $I_{t2}$ criterion

If ESD device A has a failure threshold current, $I_{t2}$, substantially lower than that of a give $I_{t2\text{-}min}$ pre-set for a specific ESD protection level, then ESD device A would not deliver the desired ESD protection and a faulty ESD protection design is determined.

5b. $I_{t2}$ comparison criterion

Assume parasitic ESD device A and the intentional ESD device B are in parallel connection and both have comparable $V_{t1}$, $V_h$ and $R_{ON}$, meaning the parasitic device A could really be a potential ESD failure weak point. If $I_{t2}$ of A is substantially higher that $I_{t2}$ of B, then, the present invention will not worry about the parasitic ESD device A due to layout errors because A can handle much more ESD transient current than the intentional ESD device B without causing any early ESD failure at all.

More ESD-critical, parameter based, parameter checking criteria can be added into the practical ESD layout design verification system of the present invention as the art gains more understanding about the ESD protection behaviours and any novel ESD protection mechanisms are discovered. However, the mechanism of the present invention can remain the same.

System Implementation And Examples

Aspects of the present invention can be implemented with C++ for both Microsoft Windows and UNIX platforms. In addition, such implementations can have a user-friendly GUI (graphical user interface). The outputs of the layout design verification system can be in netlist and text and graphical formats. Currently, ten typical ESD device model graphs, e.g., ggNMOS, ggPMOS (grounded-gate PMOS where the gate is connected to the source and n-well body), SCR, MVSCR (middle trigger voltage SCR), LVSCR, dual-SCR (dual-direction SCR), vertical pnp BJT, lateral pnp, npn BJT and a novel all-in-one ESD unit discussed in the below-referenced H. Feng, K. Gong, and A. Wang article, are defined in the ESD device technology file 23 (FIG. 2). Virtually any new ESD devices can be defined for the system as they are devised.

EXAMPLE 1

Figure 8:
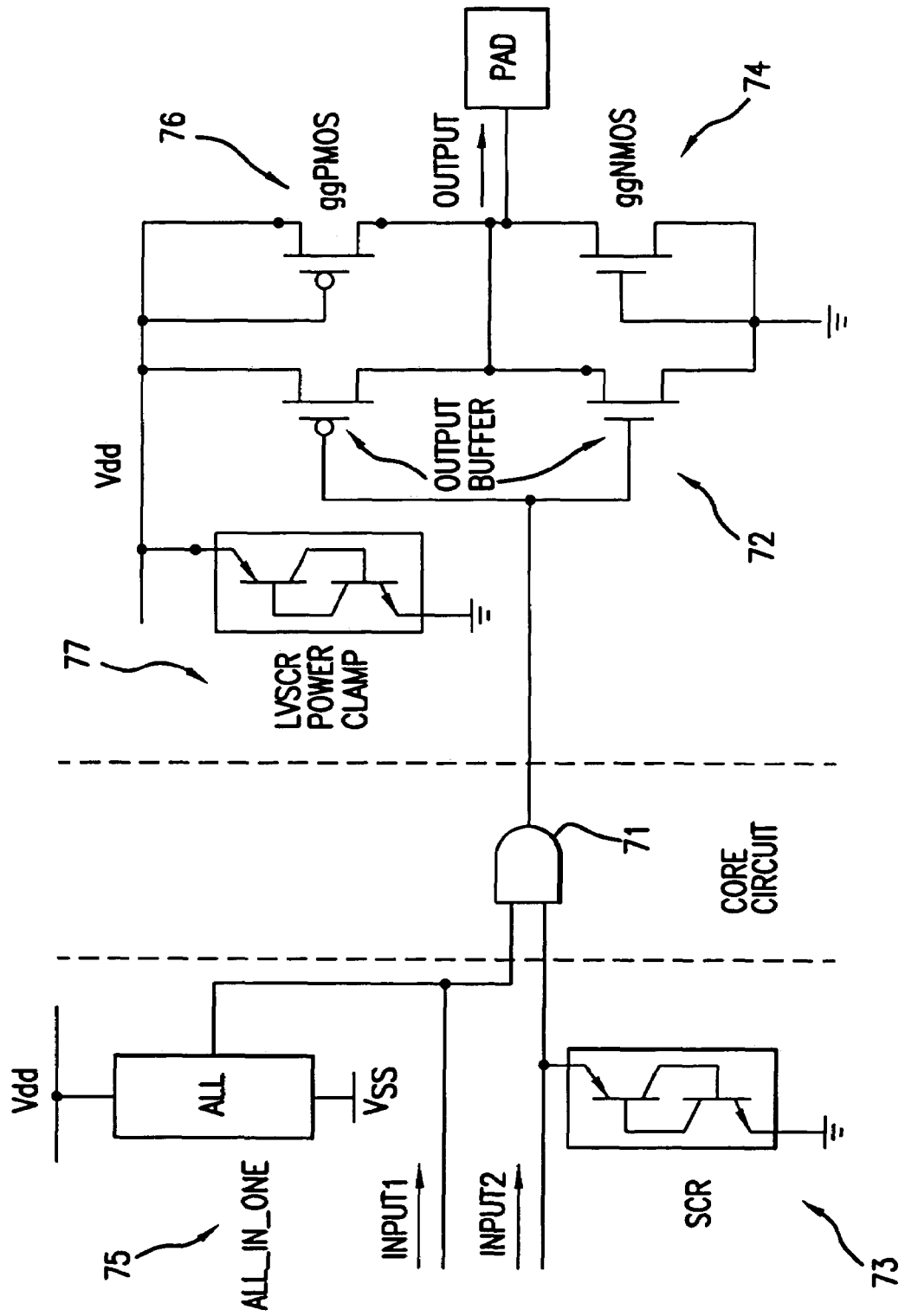
FIG. 8 illustrates a schematic of an example ESD protection circuit with the symbolic core circuit being an AND gate.

As an example, a practical ESD protection circuit is used to demonstrate the function of the system. As shown in FIG. 8, the schematic with a core circuit (represented symbolically by an AND gate 71 and a CMOS output buffer 72) under protection, uses five types of ESD devices, i.e., a SCR ESD 73, a novel all-in-one ESD protection unit 75 at input, ggNMOS 74 and ggPMOS 76 paired ESD protection units at output, and a LVSCR 77 as power clamp protection unit. All ESD devices have been thoroughly tested in a commercial CMOS process.

As an example, a practical ESD protection circuit is used to demonstrate the function of the system. As shown in FIG. 8, the schematic with a core circuit (represented symbolically by an AND gate 71) under protection, uses three types of ESD devices, i.e., a SCR ESD 73, a novel all-in-one ESD protection unit 75 at input, ggNMOS and ggPMOS pair at output, and a LVSCR 77 as power clamp. All ESD devices have been thoroughly tested in a commercial CMOS process.

Figure 9:
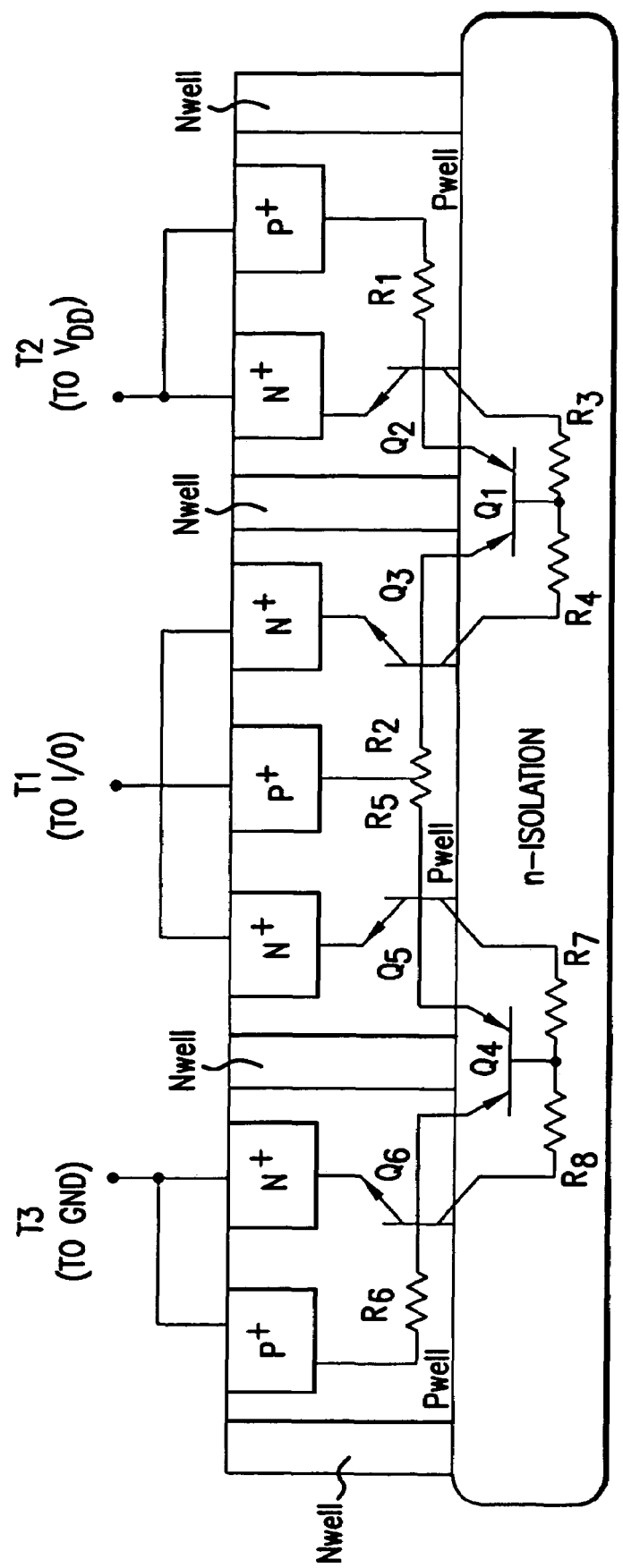
FIG. 9 illustrates a cross-section for a novel, irregular all-in-one ESD device, which has three terminals, connected to $V_{dd}$, I/O and $V_{ss}$ respectively, and be able to actively discharge ESD transients in any direction.

FIG. 9 illustrates the cross-section of the all-in-one ESD device that is a three terminal device, connected to $V_{dd}$, I/O and $V_{SS}$ respectively, and provides active ESD discharging paths in all directions as set forth in H. Feng, K. Gong, and A. Wang, "A Novel on-Chip Electrostatic Discharge Protection Design for RFIC's", *J. Microelectronics, Vol.* 32/3, *Elsevier Science*, pp 189–195, March 2001. This unique all-in-one ESD device is included in this example to demonstrate that any newly devised novel ESD devices may be recognized by the Layout Extractor assuming proper device model graph definition.

Figure 10:
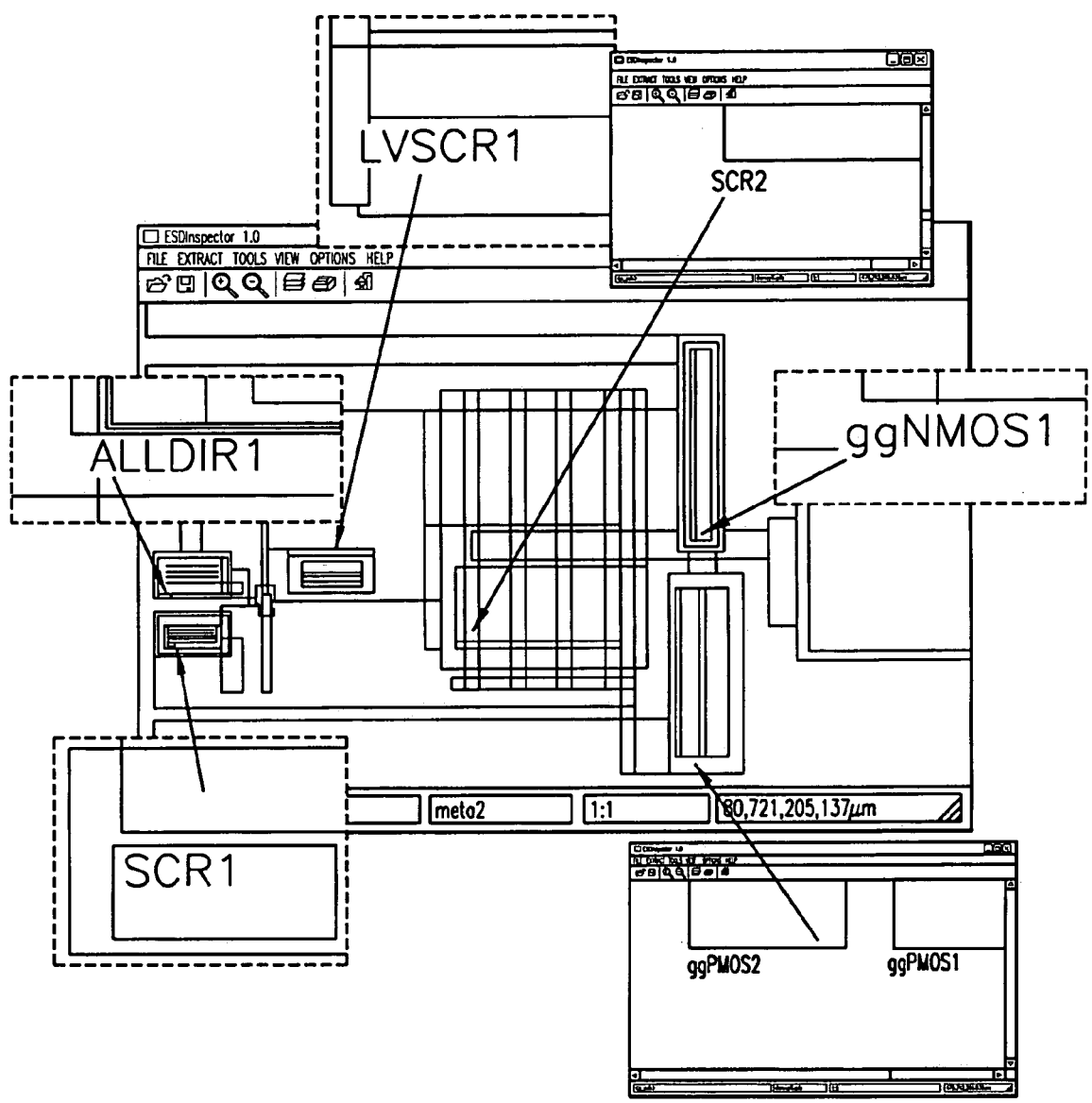
FIG. 10 illustrates a layout of the example circuit in FIG. 9 shown in the GUI of the verification system which illustrates the extracted ESD devices marked by highlight marker.

FIG. 10 represents the corresponding layout shown in the GUI of the Layout Extractor. For demonstration purpose, an intermediate netlist report generated before device count reduction module is listed below, where each extracted ESD device is represented by its name and terminal nodes in one line. The output file correctly reports all intentionally designed ESD devices, i.e., LVSCR1 for the LVSCR power clamp, SCR1 for the input SRC ESD device, ALLDIR for the all-in-one ESD protection unit at input, ggNMOS1 and ggPMOS1 & 2 for the output ESD protection. Note that two ggPMOS devices, in parallel, are extracted for the two-finger ggPMOS structure because each finger is detected as an individual device by the extraction engine. In addition, a set of parasitic ESD-type devices, MVSCR1 and SCR2–6, are extracted as well.

ALLDIR1 Vdd Input1 GND (Intermediate text report)
LVSCR1 Vdd Gnd
MVSCR1 Vdd Gnd
SCR1 Input2 Gnd
SCR2 Vdd Gnd
SCR3 Vdd Gnd
SCR6 Vdd Gnd
ggNMOS1 Output Gnd Gnd
ggPMOS1 Output Vdd Vdd
ggPMOS2 Output Vdd Vdd Next, the device reduction module executes to eliminate non-critical ESD-type devices that do not play any role in ESD protection operation, using parametric and electrical connectivity criteria. In this example, ESD-critical parameters extracted indicate that parasitic MVSCR1, extracted within the LVSCR power clamp, and parasitic SCR3–6, extracted from the core circuit, have much higher trigger voltages than the pre-set criterion value. Hence, they are not ESD-critical devices and can be removed.

However, parasitic SCR2, extracted from the output buffer unit, has a triggering voltage close to that of the nearby power clamp, LVSCR1. Further, since parametric and connectivity checking indicate that SCR2 is in parallel with and has a discharging resistance comparable to the intentional LVSCR power clamp, potential risk exists for parasitic SCR2 to compete with the intentional LVSCR power clamp under ESD discharging, resulting in possible ESD accidental triggering and early damage. Hence, the parasitic SCR2 should be retained in the final netlist, as listed below, along with all intentional ESD devices, for further ESD design verification such as ESD LVS and for functionality checking in the future.

ALLDIR1 Vdd Input1 GND (Final text report)
LVSCR1 Vdd Gnd
SCR1 Input1 Gnd
SCR2 Vdd Gnd
ggNMOS1 Output Gnd Gnd ggPMOS1 Output Vdd Vdd
ggPMOS2 Output Vdd Vdd In addition to a text output, graphical output can be generated in the GUI. All detected intentional and parasitic ESD-type elements are frame-marked for designers to quickly locate these highly ESD-sensitive areas for any possible layout design errors. The run time of the whole extraction procedure of this example from Preprocessing to GUI refresh is about 8.12 seconds on MS Windows platform with 128 MB memory.

EXAMPLE 2

Figure 11:
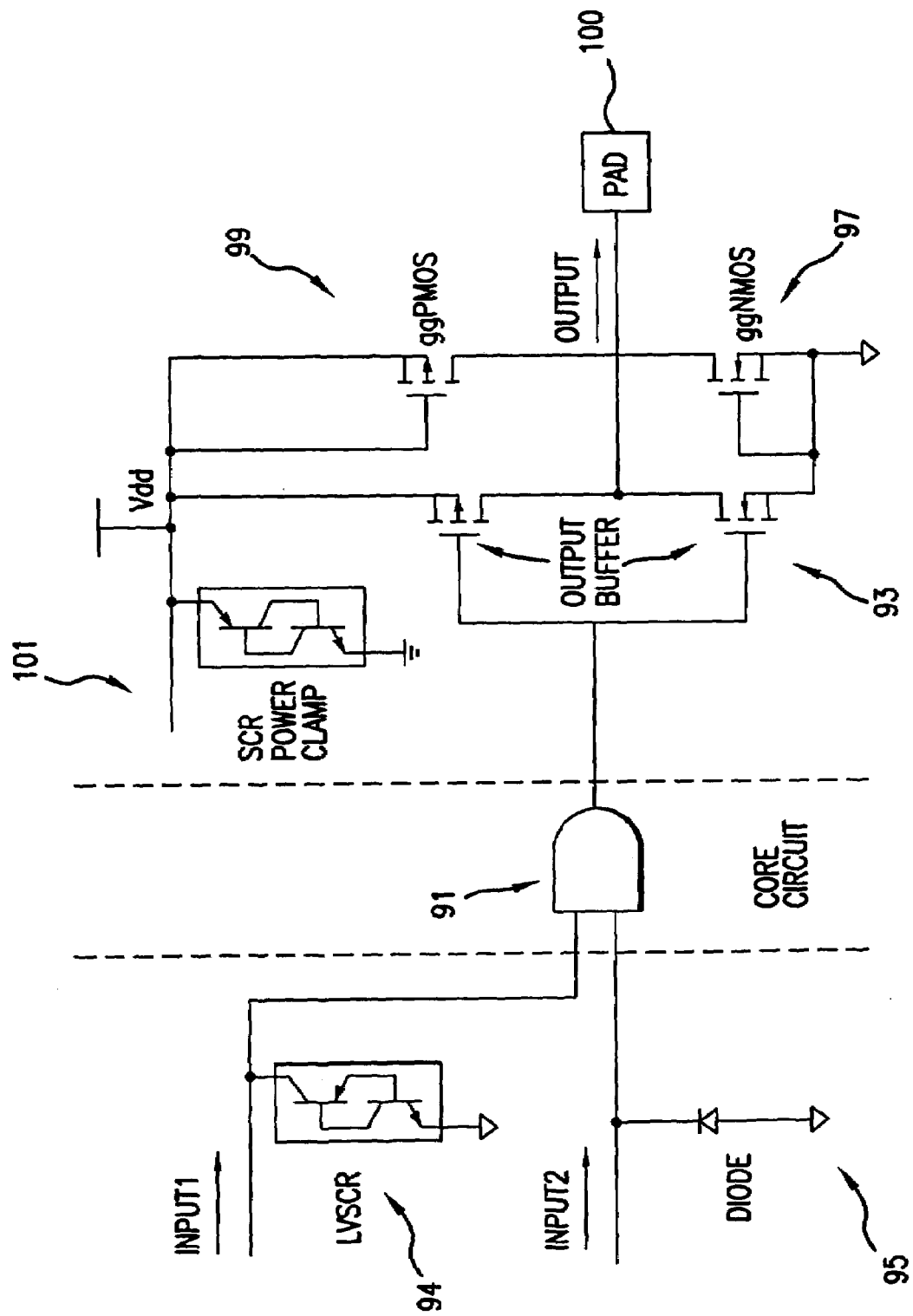
FIG. 11 illustrates a schematic of a second example ESD protection circuit.

As a second application example, the method of the present invention was applied to a specially designed IC chip with ESD protection circuitry shown in FIG. 11 where the core circuit 91 being protected is a symbolic digital gate and an output CMOS buffer 93. Five types of ESD protection structures are used including a LVSCR (low-V SCR) 94 at input-1, a Diode 95 at input-2, a complementary ggNMOS 97 and ggPMOS 99 (grounded-gate PMOS) pair at output pad 100 and a SCR 101 as the power clamp. This chip was designed and fabricated in a commercial 0.35 μm BiCMOS and tested for full function.

Auto extraction of all ESD-type devices and the corresponding ESD-critical parameters were conducted first with the initial complete ESD netlist generated, listed below, where each extracted ESD device is presented by its name, terminal nodes and ESD-critical parameters in a line.

*complete netlist file created from D:/gdsii/demop6.gds
LVSCR1 Input1 Gnd $\beta_{NPN}\beta_{PNP}$=62.62758 Vt1=8.86156
    It1=0.00504881    Vh=2.97375    Ih=0.0585548
    Ron=8.36588
MVSCR1 Input1 Gnd $\beta_{NPN}\beta_{PNP}$=56.84202 Vt1=9.78726
    It1=0.00572679    Vh=2.57119    Ih=0.0147246
    Ron=8.36588
Diode-PW/NW1 Input2 Gnd Vt1=0.7 It1=0.00583679
    Ron=187.36588
SCR1 Vdd Gnd $\beta_{NPN}\beta_{PNP}$=22.780656 Vt1=19.4619
    It1=0.0238095 Vh=4.3142 Ih=0.100444 Ron=16
SCR2 Vdd Gnd $\beta_{NPN}\beta_{PNP}$=11.1618 Vt1=19.5089
    It1=0.0189 Vh=4.37456 Ih=0.10233 Ron=17.09213
SCR3 Vdd Gnd $\beta_{NPN}\beta_{PNP}$=0.5588
SCR4 Vdd Gnd $\beta_{NPN}\beta_{PNP}$=0.5588
SCR5 Vdd Gnd $\beta_{NPN}\beta_{PNP}$=0.5588
SCR6 Vdd Gnd $\beta_{NPN}\beta_{PNP}$=0.5588
ggNMOS1 Output Gnd Gnd $\beta$=10.9947 Vt1=9.39176
    It1=0.018315 Vh=7.60567 Ih=0.201368 Ron=19.66
ggPMOS1 Output Vdd Vdd $\beta$=3.27539 Vt1=9.66812
    It1=0.0295047    Vh=7.6164116    Ih=0.1932792
    Ron=14.375
ggPMOS2 Output Vdd Vdd $\beta$=3.27539 Vt1=9.66812
    It1=0.0295047    Vh=7.6164116    Ih=0.1932792
    Ron=14.375

The output file correctly reports all intentional ESD protection devices, i.e., SCR1 for the SCR power clamp 101, LVSCR1 and Diode1 for the two input ESD protection devices, 94, 95, ggNMOS1 and ggPMOS1&2 for the output ESD protection devices 97, 99. Note that two ggPMOS devices are extracted corresponding to the two-finger ggPMOS layout pattern. The extracted parasitic ESD-type devices include one middle-voltage SCR type device, MVSCR1, within the LVSCR1; and five extra SCR devices, i.e., SCR2 within the output buffer and SCR3/4/5/6 inside the core digital gate circuitry. Related ESD-critical parameters for all the extracted ESD-type devices are also extracted and listed.

Next, the present invention executes the ESD device count reduction routine to eliminate any non-critical ESD-type devices extracted, using the smart parametric checking mechanism. In this example, the extracted ESD-critical parameters for the parasitic MVSCR1 show a much higher $V_{t1}$ (9.78726V) than LVSCR1 (8.86156V) and SCR3–6 have $\beta$-products less than 1. As a result, they are non-critical parasitic ESD devices and should be removed from the list. However, the parasitic SCR2 has a $V_{t1}$ (19.5089V) comparable to that of the power clamp device, SCR1 (19.4619V), and are placed close to each other in the layout. Hence, SCR2 cannot be removed from the netlist yet. Further, since SCR2 is in parallel with and has a discharging $R_{ON}$ (17.09213Ω) comparable to that of the intentional SCR1 power clamp (16Ω), potential risk exists for parasitic SCR2 to compete against the intentional SCR1 power clamp under ESD stresses. Therefore, possible early ESD failure may occur associated with the parasitic SCR2 device in this layout design. Hence, the parasitic SCR2 should be retained in the final ESD netlist, as listed below after ESD device count reduction, for further ESD design verification.

*final netlist file created from D:/gdsii/demop6.gds
LVSCR1 Input1 Gnd $\beta_{NPN}\beta_{PNP}$=62.62758 Vt1=8.86156
    It1=0.00504881    Vh=2.97375    Ih=0.0585548
    Ron=8.36588
Diode-PW/NW1 Input2 Gnd Vt1=0.7 It1=0.00583679
    Ron=187.36588
SCR1 Vdd Gnd $\beta_{NPN}\beta_{PNP}$=22.780656 Vt1=19.4619
    It1=0.0238095 Vh=4.3142 Ih=0.100444 Ron=16
SCR2 Vdd Gnd $\beta_{NPN}\beta_{PNP}$=11.1618 Vt1=19.5089
    It1=0.01895 Vh=4.37456 Ih=0.10233 Ron=29.3
ggNMOS1 Output Gnd Gnd $\beta$=10.9947 Vt1=9.39176
    It1=0.018315 Vh=7.60567 Ih=0.201368 Ron=19.66
ggPMOS1 Output Vdd Vdd $\beta$=3.27539 Vt1=9.66812
    It1=0.0295047    Vh=7.6164116    Ih=0.1932792
    Ron=14.375
ggPMOS2 Output Vdd Vdd $\beta$=3.27539 Vt1=9.66812
    It1=0.0295047    Vh=7.6164116    Ih=0.1932792
    Ron=14.375

Figure 12:
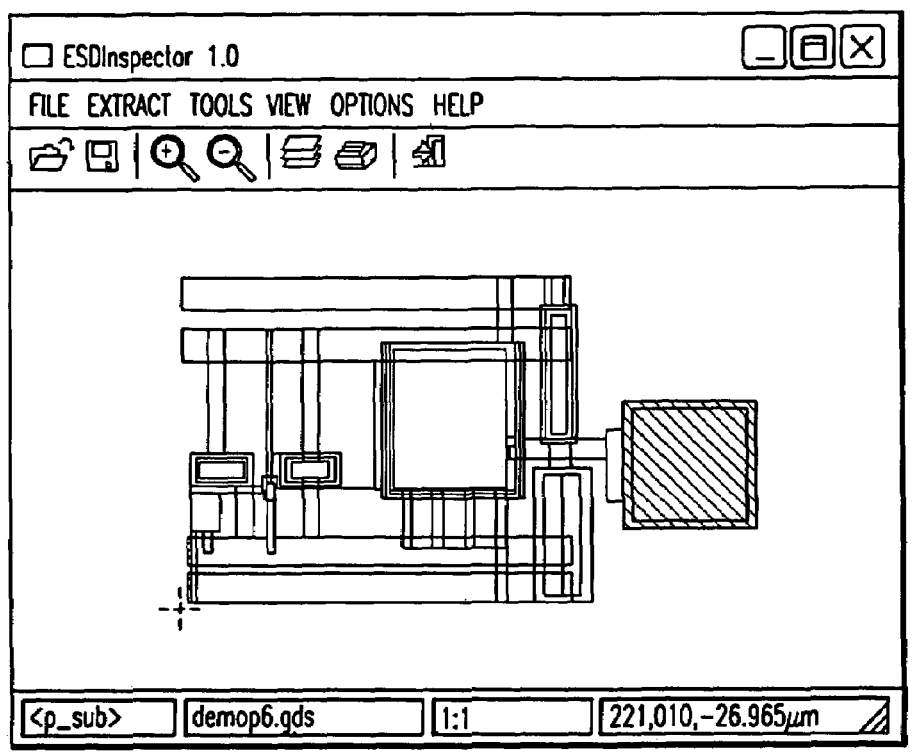
FIG. 12 shows the original chip layout of the circuit of FIG. 11 in a GUI according to the present invention.
Figure 13:
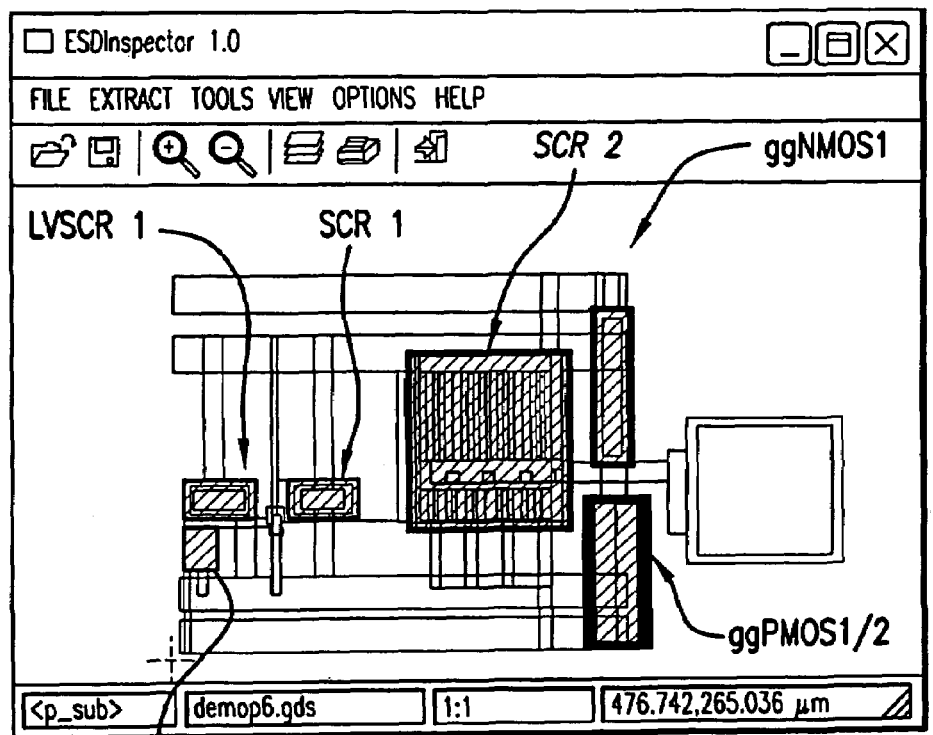
FIG. 13 shows the graphical output for the FIG. 11 circuit after ESD device count reduction, with all extracted ESD-type devices identified with frame markers.

FIG. 12 shows the original chip layout in the GUI of the present invention. FIG. 13 shows the graphical output for this circuit after the ESD device count reduction execution with all extracted intentional and parasitic ESD-type devices shown and identified with frame markers for easy debugging. The run time of the whole execution for this example circuit from Preprocessing to GUI refresh is about 8.2 s on Windows platform with 128 MB memory.

In conclusion, the present invention has provided a new technology-independent ESD layout design verification method and CAD tool for accurately extracting arbitrary ESD devices of any type. The subgraph isomorphism and decomposition techniques provide the system of the present invention with a very powerful and efficient ESD device extractor.

According to the foregoing, there has been described a smart parameter checking system and method for on-chip ESD protection circuit physical design layout verification. The person having ordinary skill in the art will appreciate that there has been described an exemplary embodiment. It will recognized that many of the functionalities described herein can be accomplished by a variety of hardware, firmware and software methods and apparatus within the scope of the present invention. Having thus described the present invention, it will be appreciated that many variations thereon will occur to the artisan upon an understanding of the present invention, which is therefore to be limited only by the appended claims in which reference to a single element shall not preclude a plurality of like elements unless otherwise stated.

We claim:
1. A smart parameter checking method for on-chip ESD protection circuit physical design layout verification, comprising:
 a) determining a first list of ESD devices, the first list including both parasitic ESD devices and all intentional ESD devices contained in the layout;
 b) determining a critical operating parameter of the listed intentional and parasitic ESD devices;
 c) comparing the critical operating parameter of the listed intentional and parasitic ESD devices and determining if the parasitic ESD devices will interfere with the operation of the intentional ESD devices to cause ESD protection malfunction;
 d) eliminating parasitic ESD devices which do not interfere with the operation of the intentional ESD devices from the first list and;
 e) providing a second list of ESD devices for verifying the validity of the ESD design layout, the second list including the intentional ESD devices and any parasitic ESD devices remaining after step (d).

2. The smart parameter checking method for on-chip ESD protection circuit physical design layout verification of claim 1, wherein:
 before being compared, the intentional and parasitic ESD devices of the first list are determined to be electrically connected to the extent that the parasitic ESD devices can interfere with the performance of the intentional ESD devices.

3. The smart parameter checking method for on-chip ESD protection circuit physical design layout verification of claim 1, further comprising:
 providing a report of ESD design verification.

4. The smart parameter checking method for on-chip ESD protection circuit physical design layout verification of claim 3, wherein:
 the report is at least one of a textual report or a graphical report.

5. The smart parameter checking method for on-chip ESD protection circuit physical design layout verification of claim 1, further comprising:
 checking the second list to see if all intentional ESD devices in the design layout are contained on the second list.

6. The smart parameter checking method for on-chip ESD protection circuit physical design layout verification of claim 1, further comprising:
 comparing the critical operating parameter against design layout specifications.

7. The smart parameter checking method for on-chip ESD protection circuit physical design layout verification of claim 1, further comprising:
 comparing a triggering voltage, $V_{t1}$, of two extracted ESD devices, A and B, that are connected in parallel, where A is a parasitic ESD device and B is an intentional ESD device, whereby if A has a sufficiently higher triggering voltage, $V_{t1}$, than B does, then A is not a parasitic device of any concern and can be removed from the first list.

8. The smart parameter checking method for on-chip ESD protection circuit physical design layout verification of claim 1, further comprising:
 comparing a triggering voltage, $V_{t1}$, of two extracted ESD devices, A and B, that are connected in parallel, where A is a parasitic ESD device and B is an intentional ESD device, whereby if A and B have a comparable $V_{t1}$, neither A nor B are removed from the first list, and the discharging impedance RON of A and B is then compared, whereby if $R_{ON}$ of A is sufficiently larger than $R_{ON}$ of B, then ESD current will discharge into device B, and A is removed from the first list.

9. The smart parameter checking method for on-chip ESD protection circuit physical design layout verification of claim 1, further comprising:
 comparing a triggering voltage, $V_{t1}$, of two extracted ESD devices, A and B, that are connected in parallel, where A is a parasitic ESD device and B is an intentional ESD device, whereby if A and B have a comparable $V_{t1}$, neither A nor B are removed from the first list, and the holding voltages $V_h$, of A and B are then compared whereby the lower $V_h$ will determine the pad voltage clamping behavior and if the lower $V_h$ is higher than the maximum acceptable pad voltage specification, a design fault will be reported.

10. The smart parameter checking method for on-chip ESD protection circuit physical design layout verification of claim 1, further comprising:
 comparing a triggering voltage, $V_{t1}$, of two extracted ESD devices, A and B, that are connected in parallel, where A is a parasitic ESD device and B is an intentional ESD device, whereby if A discharges the majority of the ESD pulse, and whereby the failure threshold $I_{t2}$ of device A is compared to a design failure threshold specification, to determine if a design fault will be reported.

11. The smart parameter checking method for on-chip ESD protection circuit physical design layout verification of claim 1, further comprising:
 comparing a total series triggering voltage, $V_{t1}$, of two extracted ESD-type devices, A and B, connected in series with any existing parallel ESD structures to determine a possible ESD discharge pattern fault.

12. The smart parameter checking method for on-chip ESD protection circuit physical design layout verification of claim 1, further comprising:
 comparing two extracted ESD devices, A and B, that are connected in parallel, where A is a parasitic ESD device of an SCR-type and B is an intentional ESD device, determining a β-product, i.e., $\beta_{NPN}\beta_{PNP}$, of A, whereby if the β-product is less than 1, then device A will be removed from the first list.

13. The smart parameter checking method for on-chip ESD protection circuit physical design layout verification of claim 1, further comprising:
 comparing two extracted ESD devices, A and B, that are connected in parallel, where A is a parasitic ESD device and B is an intentional ESD device, determining a $V_{t1}$ of the device A, whereby if the $V_{t1}$ of device A is approximately 10% higher than a given threshold voltage, $V_{t1-max}$, pre-set for a specific ESD protection circuitry, device A will be removed from the first list.

14. The smart parameter checking method for on-chip ESD protection circuit physical design layout verification of claim 1, further comprising:
 comparing two extracted ESD devices, A and B, that are connected in series, where A is a parasitic ESD device and B is an intentional ESD device, whereby if the total triggering voltage of a combined A+B ESD network is the sum of $V_{t1}$ of A and B.

15. The smart parameter checking method for on-chip ESD protection circuit physical design layout verification of claim 1, further comprising:

comparing two extracted ESD devices A and B that are connected in parallel, whereby if A has a substantially higher holding point, $V_h$, than B does while device A is intended to be a main ESD discharging device, then reporting a faulty design.

16. The smart parameter checking method for on-chip ESD protection circuit physical design layout verification of claim 1, further comprising:

whereby if an ESD device A has an effective ESD discharging impedance $R_{ON}$ substantially higher than a given $R_{ON-max}$ which is required for the design layout, then reporting a faulty design.

17. The smart parameter checking method for on-chip ESD protection circuit physical design layout verification of claim 1, further comprising:

comparing two extracted ESD devices, A and B, whereby if ESD devices A and B, with comparable $V_{t1}$, are connected in parallel and device A has a substantially larger $R_{on}$ than B does, then device A will be removed from the first list.

18. The smart parameter checking method for on-chip ESD protection circuit physical design layout verification of claim 1, further comprising:

whereby if an ESD device A has a failure threshold current, $I_{t2}$, substantially lower that of a given $I_{t2-min}$ which is required for the design layout, then reporting a faulty design.

19. The smart parameter checking method for on-chip ESD protection circuit physical design layout verification of claim 1, further comprising:

comparing two extracted ESD devices, A and B, whereby parasitic ESD device A and intentional ESD device B are in parallel connection and both have comparable $V_{t1}$, $V_h$ and $R_{ON}$, whereby if $I_{t2}$ of A is substantially higher that $I_{t2}$ of B, then, a fault will not be reported.

20. The smart parameter checking method for on-chip ESD protection circuit physical design layout verification of claim 1, wherein the critical operating parameters are derived from device physics equations.

21. A smart parameter checking method for on-chip ESD protection circuit physical design layout verification, comprising:

a) determining a first list of ESD devices, the first list including intentional and parasitic ESD devices contained in the layout;
b) determining a critical operating parameter of the listed both parasitic ESD devices and all intentional ESD devices, the critical operating parameter selected from the group with consisting of gain, β; voltage and current triggering thresholds ($V_{t1}$, $I_{t1}$); voltage and current holding points ($V_h$, $I_h$); discharging resistance ($R_{ON}$); and voltage and current thermal failure thresholds ($V_{t2}$, $I_{t2}$);
c) comparing the critical operating parameter of the listed intentional and parasitic ESD devices and determining if the parasitic ESD devices will interfere with the operation of the intentional ESD devices to cause ESD protection malfunction;
d) eliminating parasitic ESD devices which do not interfere with the operation of the intentional ESD devices from the first list and;
e) providing a second list of ESD devices for verifying the validity of the ESD design layout, the second list including the intentional ESD devices and any parasitic ESD devices remaining after step (d).

22. A smart parameter checking method for on-chip ESD protection circuit physical design layout verification, comprising:

a) taking a design layout input and making a target graph;
b) taking a known device structure layout and making a model graph;
c) comparing the target graph and the model graph to determine a first list of all intentional and parasitic ESD devices;
d) determining a plurality of critical operating parameters for all intentional and parasitic ESD devices;
e) comparing the first list of ESD devices to a design list to verify presence of all intentional ESD devices;
f) comparing the critical operating parameters of intentional and parasitic ESD devices and eliminating from the first list parasitic ESD devices which do not interfere with the operation of the intentional ESD devices to cause ESD protection malfunction and;
g) providing a second list of ESD devices for verifying the validity of the ESD design layout, the second list including the intentional ESD devices and any parasitic ESD devices remaining after step (f).

23. The smart parameter checking method for on-chip ESD protection circuit physical design layout verification of claim 22, wherein the comparing of step c) is done by subgraph isomorphism and decomposition.

24. The smart parameter checking method for on-chip ESD protection circuit physical design layout verification of claim 22, wherein the plurality of critical operating parameters is selected from the group including: gain, β; voltage and current triggering thresholds ($V_{t1}$, $I_{t1}$); voltage and current holding points ($V_h$, $I_h$); discharging resistance ($R_{ON}$); and voltage and current thermal failure thresholds ($V_{t2}$, $I_{t2}$).

25. The smart parameter checking method for on-chip ESD protection circuit physical design layout verification of claim 24, further comprising:

comparing the plurality of critical operating parameters of the intentional ESD devices to design specifications.

26. The smart parameter checking method for on-chip ESD protection circuit physical design layout verification of claim 25, further comprising:

deriving the critical operating parameters from device physics equations.

* * * * *

UNITED STATES PATENT AND TRADEMARK OFFICE
CERTIFICATE OF CORRECTION

PATENT NO. : 7,243,317 B2  Page 1 of 1
APPLICATION NO. : 10/449669
DATED : July 10, 2007
INVENTOR(S) : Albert Zihui Wang and Rouying Zhan It is certified that error appears in the above-identified patent and that said Letters Patent is hereby corrected as shown below:

Column 21, line 44, cancel the text beginning with "21. A smart parameter" to and ending "remaining after step (d)." in column 22, line 10, and insert the following claim:

21. A smart parameter checking method for on-chip ESD protection circuit physical design layout verification, comprising:
a) determining a first list of ESD devices, the first list including both parasitic ESD devices and all intentional ESD devices contained in the layout;
b) determining a critical operating parameter of the listed intentional and parasitic ESD devices, the critical operating parameter selected from the group consisting of gain, β; voltage and current triggering thresholds ($V_{t1}$, $I_{t1}$); voltage and current holding points ($V_h$, $I_h$); discharing resistance ($R_{ON}$); and voltage and current thermal failure thresholds ($V_{t2}$, $I_{t2}$);
c) comparing the critical operating parameter of the listed intentional and parasitic ESD devices and determining if the parasitic ESD devices will interfere with the operation of the intentional ESD devices to cause ESD protection malfunction;
d) eliminating parasitic ESD devices which do not interfere with the operation of the intentional ESD devices from the first list; and
e) providing a second list of ESD devices for verifying the validity of the ESD design layout, the second list including the intentional ESD devices and any parasitic ESD devices remaining after step (d).

Signed and Sealed this

Fifteenth Day of January, 2008

JON W. DUDAS
*Director of the United States Patent and Trademark Office*